(12) United States Patent
Kurokawa

(10) Patent No.: US 9,679,628 B2
(45) Date of Patent: Jun. 13, 2017

(54) SEMICONDUCTOR MEMORY DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/837,261

(22) Filed: Aug. 27, 2015

(65) Prior Publication Data

US 2016/0064400 A1  Mar. 3, 2016

(30) Foreign Application Priority Data

Aug. 29, 2014 (JP) .................................. 2014-175609

(51) Int. Cl.
| | |
|---|---|
| *G11C 11/402* | (2006.01) |
| *H01L 29/786* | (2006.01) |
| *G11C 11/34* | (2006.01) |
| *H01L 27/146* | (2006.01) |
| *H01L 27/1156* | (2017.01) |

(Continued)

(52) U.S. Cl.
CPC ............ *G11C 11/402* (2013.01); *G11C 11/34* (2013.01); *G11C 11/565* (2013.01); *H01L 27/0688* (2013.01); *H01L 27/1156* (2013.01); *H01L 27/146* (2013.01); *H01L 29/7869* (2013.01);

(Continued)

(58) Field of Classification Search
CPC ............... H01L 27/146; H01L 27/0688; H01L 27/1156; H01L 29/7869; H01L 21/8258; H01L 21/02; H01L 21/20; H01L 21/65; H01L 21/336; H01L 21/8242; H01L 21/8247; H01L 27/10; H01L 27/108; H01L 27/115; H01L 27/12; H01L 29/786; H01L 29/788; H01L 29/792; H01L 121/76254; H01L 27/11517; G11C 11/34; G11C 11/565; G11C 2029/0403; G11C 11/405; G11C 11/56; G11C 11/403; G11C 16/0433; G11C 16/26

See application file for complete search history.

(56) References Cited

U.S. PATENT DOCUMENTS 3,955,181 A * 5/1976 Raymond, Jr. ........ G11C 11/402
                                                    257/300
3,986,180 A * 10/1976 Cade ...................... G11C 11/35
                                                    257/272

(Continued)

FOREIGN PATENT DOCUMENTS

JP     2012-256400 A    12/2012

*Primary Examiner* — Khamdan Alrobaie
*Assistant Examiner* — Ajay Ojha
(74) *Attorney, Agent, or Firm* — Fish & Richardson P.C.

(57) ABSTRACT

To provide a memory cell for storing multilevel data that is less likely to be affected by variations in characteristics of transistors and that is capable of easily writing multilevel data in a short time and accurately reading it out. In writing, a current corresponding to multilevel data is supplied to the transistor in the memory cell and stored as the gate-drain voltage of the transistor in the memory cell. In reading, a current is supplied to the transistor in the transistor with the stored gate-drain voltage, and the multilevel data is obtained from the voltage supplied to generate a current that is equal to the current.

10 Claims, 23 Drawing Sheets

(51) Int. Cl.
    *G11C 11/56*     (2006.01)
    *H01L 27/06*     (2006.01)
    *G11C 29/04*     (2006.01)
    *H01L 21/8258*     (2006.01)

(52) U.S. Cl.
    CPC .. *G11C 2029/0403* (2013.01); *H01L 21/8258* (2013.01)

(56) References Cited

U.S. PATENT DOCUMENTS

| | | | |
|---|---|---|---|
| 5,705,807 | A | 1/1998 | Throngnumchai |
| 7,046,282 | B1 | 5/2006 | Zhang et al. |
| 2006/0285391 | A1* | 12/2006 | Cernea ............... G11C 7/02 365/185.22 |
| 2011/0133706 | A1 | 6/2011 | Takahashi et al. |
| 2011/0176038 | A1 | 7/2011 | Kurokawa et al. |
| 2011/0198483 | A1 | 8/2011 | Kurokawa |
| 2011/0199807 | A1* | 8/2011 | Saito ............... G11C 11/405 365/72 |
| 2011/0255325 | A1* | 10/2011 | Nagatsuka ......... G11C 11/405 365/72 |
| 2012/0033488 | A1 | 2/2012 | Nagatsuka et al. |
| 2013/0016035 | A1 | 1/2013 | Ikeda |
| 2013/0222584 | A1 | 8/2013 | Aoki et al. |
| 2014/0050025 | A1* | 2/2014 | Tsao ............... G11C 14/0063 365/185.08 |
| 2015/0380451 | A1* | 12/2015 | Kurokawa ....... H01L 27/14632 257/43 |

\* cited by examiner

SEMICONDUCTOR MEMORY DEVICE

BACKGROUND OF THE INVENTION

1. Field of the Invention

One embodiment of the present invention relates to a semiconductor device, a method for operating the semiconductor device, or the like. For example, one embodiment of the present invention relates to a storage device, a method for operating the storage device, or the like.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

In recent years, with the increase in the amount of data manipulated, a semiconductor device having a large storage capacity has been required. In such situations, the semiconductor device disclosed in Patent Document 1 has a structure in which multilevel data is stored and read out.

REFERENCE

[Patent Document 1] Japanese Published Patent Application No. 2012-256400

SUMMARY OF THE INVENTION

In the case of a storage device, its miniaturization reduces the area of a memory cell, so that the manufacturing cost per unit storage capacity can be reduced. In the case of a flash memory, more than 1 bit of data, that is, multilevel data is stored in a memory cell, whereby the area per bit is reduced and thus the manufacturing cost per unit storage capacity can be reduced.

A flash memory stores data by utilizing the threshold voltage of a transistor in a memory cell that varies depending on the amount of charge accumulated in a floating gate of the transistor.

Variations in the characteristics of transistors in memory cells lead to variations in the threshold voltage and the amount of charge accumulated in a floating gate between the transistors even when data is written under the same writing conditions (e.g., voltage and time). That is, different data are written to the memory cells.

To avoid the above problems, for example, a method in which data is written until a desired threshold voltage is reached while pieces of data are sequentially read out, that is, verify operation is employed. In this method, however, written pieces of data are sequentially read out to verify whether each piece of data corresponds to a desired data, so that it takes a long time for data writing. Particularly in the case where multilevel data is stored in a memory cell, the threshold voltage needs to fall within a narrow range; thus, it takes an extremely long time for data writing.

An object of one embodiment of the present invention is to provide a semiconductor device capable of writing multilevel data that is less likely to be affected by variations in the electrical characteristics of transistors. Another object is to shorten time required to write multilevel data. Another object is to read multilevel data accurately. Another object is to provide a novel semiconductor device, an operating method for the novel semiconductor device, or a manufacturing method for the novel semiconductor device.

Note that the description of a plurality of objects does not preclude the existence of each object. Note that one embodiment of the present invention does not necessarily achieve all the objects listed above. Other objects will be apparent from and can be derived from the description of the specification, the drawings, the claims, and the like, and such objects could be objects of one embodiment of the present invention.

One embodiment of the present invention is a semiconductor device including a memory cell and first to fifth wirings. The memory cell includes a first transistor, a second transistor, a third transistor, a first capacitor, the first wiring, the second wiring, the third wiring, the fourth wiring, and the fifth wiring. One of a source and a drain of the first transistor is electrically connected to the first wiring. The other of the source and the drain of the first transistor is electrically connected to one terminal of the first capacitor and one of a source and a drain of the second transistor. A gate of the first transistor is electrically connected to the other terminal of the first capacitor and one of a source and a drain of the third transistor. The other of the source and the drain of the second transistor is electrically connected to the fifth wiring. A gate of the second transistor is electrically connected to the third wiring. The other of the source and the drain of the third transistor is electrically connected to the second wiring. A gate of the third transistor is electrically connected to the fourth wiring.

The semiconductor device of the above embodiment may also include a fourth transistor, a fifth transistor, a first circuit, and sixth to eighth wirings. One of a source and a drain of the fourth transistor is electrically connected to the fifth wiring. The other of the source and the drain of the fourth transistor is electrically connected to the eighth wiring. A gate of the fourth transistor is electrically connected to the sixth wiring. One of a source and a drain of the fifth transistor is electrically connected to the first circuit. The other of the source and the drain of the fifth transistor is electrically connected to the fifth wiring. A gate of the fifth transistor is electrically connected to the seventh wiring. The first circuit has a function of determining whether a current flowing through the fifth wiring is equal to a current flowing through the fourth transistor.

One embodiment of the present invention is a semiconductor device including a memory cell, a fourth transistor, a fifth transistor, a first circuit, a first wiring, and sixth to eighth wirings. The memory cell is electrically connected to the first wiring. One of a source and a drain of the fourth transistor is electrically connected to the first wiring. The other of the source and the drain of the fourth transistor is electrically connected to the eighth wiring. A gate of the fourth transistor is electrically connected to the sixth wiring. One of a source and a drain of the fifth transistor is electrically connected to the first circuit. The other of the source and the drain of the fifth transistor is electrically connected to the first wiring. A gate of the fifth transistor is electrically connected to the seventh wiring. The first circuit has a function of determining whether a current flowing through the first wiring is equal to a current flowing through the fourth transistor.

According to one embodiment of the present invention, a semiconductor device that is less likely to be affected by variations in characteristics of transistors and that is capable of writing multilevel data can be provided. Alternatively, according to one embodiment of the present invention, time required to write multilevel data can be shortened. Alternatively, multilevel data can be read out accurately. Alternatively, multilevel data can be written easily. Alternatively, according to one embodiment of the present invention, a novel semiconductor device, an operating method for the novel semiconductor device, or a manufacturing method for the novel semiconductor device can be provided.

Note that the description of these effects does not disturb the existence of other effects. One embodiment of the present invention does not necessarily have all the effects listed above. Other effects will be apparent from and can be derived from the description of the specification, the drawings, the claims, and the like.

DETAILED DESCRIPTION OF THE INVENTION

Figure 1A:
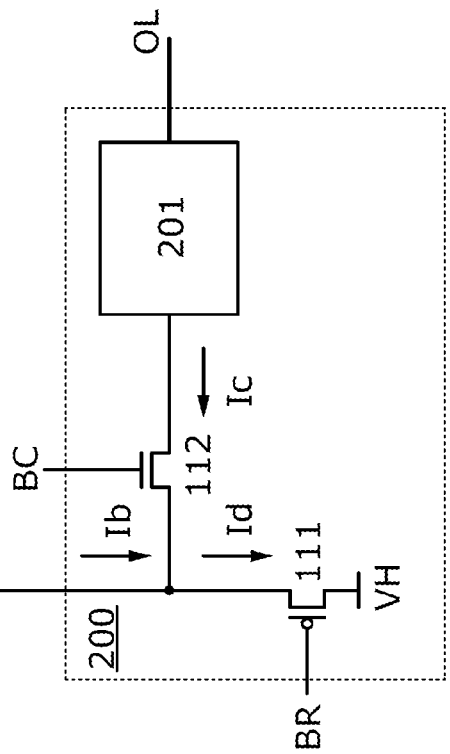
FIGS. 1A and 1B are circuit diagrams each illustrating an example of a memory cell and a write/read circuit.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings.

Terms such as "first", "second", and "third" in this specification may be used in order to avoid confusion among components, and thus do not limit the number of components or do not limit the order. For example, the term "first" can be replaced with the term "second", "third", or the like.

Functions of a "source" and a "drain" of a transistor are sometimes replaced with each other when a transistor of opposite polarity is used or when the direction of current flow is changed in circuit operation, for example. Therefore, the terms "source" and "drain" can be used to denote the drain and the source, respectively, in this specification.

A voltage usually refers to a difference between a given potential and a reference potential (e.g., a ground potential). Thus, a voltage can be referred to as a potential and vice versa. Note that the potential indicates a relative value. Accordingly, "ground potential" does not necessarily mean 0 V.

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, that is, the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y. A switch is controlled to be on or off. That is, a switch is conducting or not conducting (is turned on or off) to determine whether a current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit and a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Other examples of the expressions also include "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are only examples and one embodiment of the present invention is not limited to the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear, and it can be determined that the embodiment is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Embodiment 1

A semiconductor device of one embodiment of the present invention will be described with reference to FIGS. 1A and 1B, FIG. 2, and FIG. 3.

FIG. 1A illustrates a configuration example of a memory cell 100 and a write/read circuit 200.

The memory cell 100 includes a transistor 101, a transistor 102, a transistor 103, and a capacitor 104. To the memory cell 100, a voltage is supplied through a wiring VH and a wiring VT, and control signals are supplied through a wiring SE and a wiring TC. Data of the memory cell is input to and output from a wiring BL.

A drain of the transistor 101 is connected to the wiring VH. A source of the transistor 101 is connected to a first terminal of the capacitor 104 and a source of the transistor 102. A gate of the transistor 101 is connected to a second terminal of the capacitor 104 and a drain of the transistor 103. A drain of the transistor 102 is connected to the wiring BL. A gate of the transistor 102 is connected to the wiring SE. A source of the transistor 103 is connected to the wiring VT. A gate of the transistor 103 is connected to the wiring TC.

The write/read circuit 200 includes a transistor 111, a transistor 112, and a read and determine circuit 201. The read and determine circuit 201 has a function of determining a current and a function of determining the timing when a current Ic flowing through the read and determine circuit 201 becomes 0 and outputting a signal indicating the determination result. For example, the read and determine circuit 201 has a function of determining the timing when a current Ib flowing through the wiring BL becomes equal to a current Id flowing through the transistor 111.

In writing data to the memory cell 100, the transistor 102 and the transistor 103 are turned on, the transistor 112 of the write/read circuit 200 is turned off, and a voltage corresponding to the data is applied to a gate of the transistor 111 from the wiring BR.

When the transistor 101 supplies a current equal to the current Id flowing through the transistor 111, the gate-source voltage of the transistor 101 becomes a voltage that depends on the current Id flowing through the transistor 111. In the stage where a stable balance is achieved, the transistor 102 and the transistor 103 are turned off, whereby the gate-source voltage of the transistor 101, which supplies the current equal to the current Id flowing through the transistor 111, is stored in the capacitor 104.

In writing data, the voltage of the capacitor 104 changes until the current Id flowing through the transistor 111 and corresponding to the data becomes equal to the current Ia flowing through the transistor 101. This structure allows writing of a desired multilevel voltage even when there are variations in the characteristics of the transistors included in the memory cell 100 or even when the transistors are normally on.

The wiring BL is additionally provided with a precharge circuit and is precharged at an intermediate voltage in the range of a writing voltage, whereby writing time can further be shortened.

Furthermore, since a voltage corresponding to data to be stored is written to the memory cell 100, a method in which data is written until a desired voltage is reached while pieces of data are sequentially read, that is, verify operation is not necessarily performed; thus, multilevel data can be written easily at high speed.

In reading data from the memory cell 100, the transistor 102 is turned on, the transistor 103 is turned off, and the transistor 112 of the write/read circuit 200 is turned on.

A voltage held in the capacitor 104 is the gate-source voltage of the transistor 101, and the current Ia that is equal to a current flowing in data writing flows through the transistor 101. Since the transistor 102 is on and the transistor 103 is off, the current Ia of the transistor 101 flows through the wiring BL. Unless there is a leakage or the like to the wiring BL, the current Ib flowing through the wiring BL is approximately equal to the current Ia flowing through the transistor 101.

When the voltage of the wiring BR that is applied to the gate of the transistor 111 is swept, a current that is equal to a difference between the current Id flowing through the transistor 111 and the current Ib flowing through the wiring BL flows as the current Ic flowing through the read and determine circuit.

The read and determine circuit 201 has a function of determining a current and a function of outputting the timing when a current flowing through the read and determine circuit 201 becomes 0. In other words, the read and determine circuit 201 can determine the timing when the current Ib flowing through the wiring BL becomes equal to the current Id flowing through the transistor 111.

The read and determine circuit 201 sweeps a voltage to be applied to the gate of the transistor 111 to determine the timing when the current Ib flowing through the wiring BL becomes equal to the current Id flowing through the transistor 111. The current Ib flowing through the wiring BL is approximately equal to the current Ia flowing through the transistor 101; thus, the read and determine circuit 201 determines the timing when the current Id flowing through the transistor 111 becomes equal to the current Ia flowing through the transistor 101.

The gate voltage of the transistor 111 is equal to the gate voltage when data is written to the memory cell 100, at the timing when the current Ib flowing through the wiring BL becomes equal to the current Id flowing through the transistor 111, that is, the timing when the current Ia flowing through the transistor 101 becomes equal to the current Id flowing through the transistor 111. The read and determine circuit 201 determines the timing when the current Ib flowing through the wiring BL becomes equal to the current Id flowing through the transistor 111, and acquires the gate voltage of the transistor 111 at that time, i.e., the voltage of the wiring BR at that time, thereby acquiring written data. Consequently, multilevel data can be accurately read out.

The transistor 102 and the transistor 103 that are off retain the voltage of the capacitor 104. Thus, the leakage current between the source and the drain of the transistor 102 that is off and the leakage current between the source and the drain of the transistor 103 that is off are required to be as low as possible. That is to say, transistors each having a low off-state current are preferably used, for example. An example of such a transistor having a low off-state current is a transistor including an oxide semiconductor in a semiconductor layer.

Figure 1B:
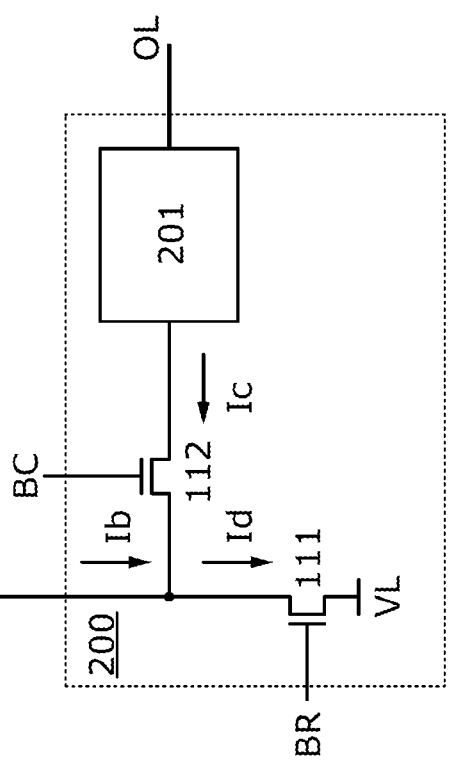

The transistor 101 and the transistor 111 may be p-channel transistors. FIG. 1B illustrates a configuration example of the memory cell 100 and the write/read circuit 200 in which the transistor 101 and the transistor 111 are p-channel transistors.

Figure 3:
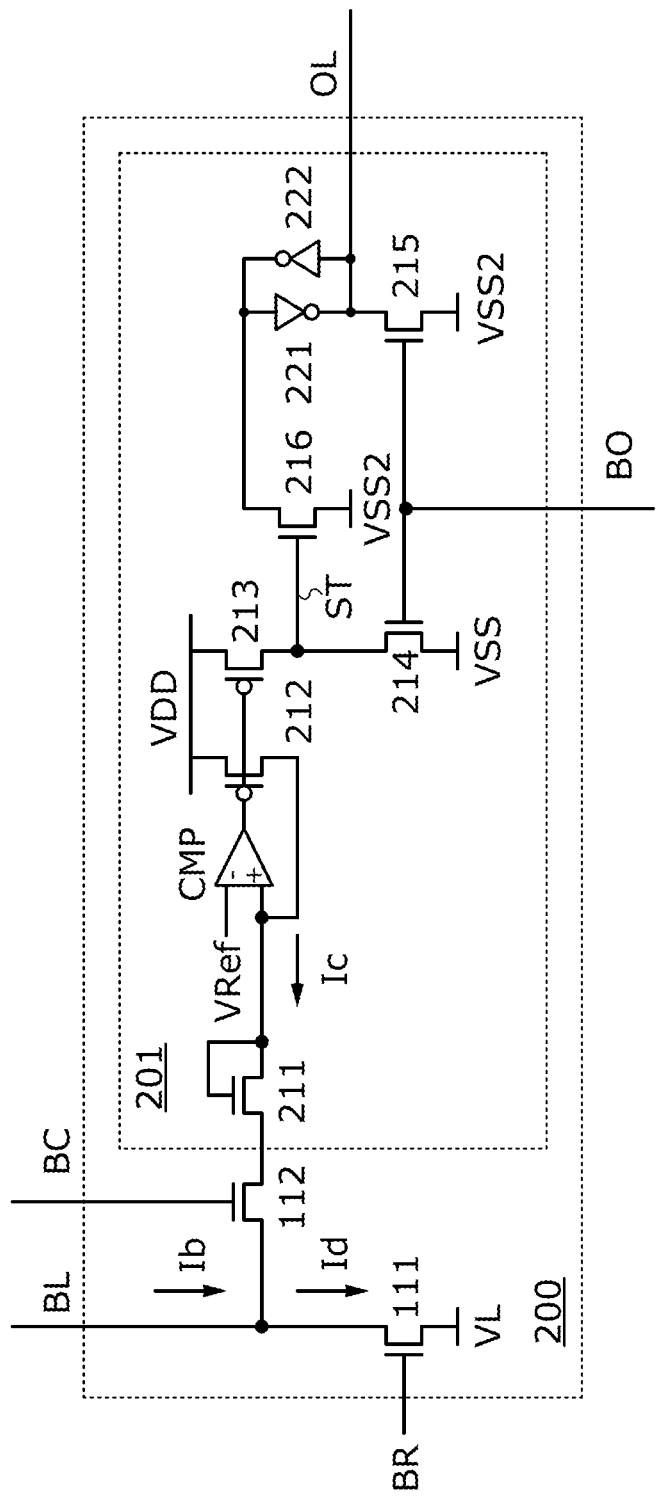
FIG. 3 is a circuit diagram illustrating an example of a write/read circuit.

FIG. 3 illustrates an example of a circuit diagram of the write/read circuit 200 that includes a circuit configuration example of the read and determine circuit 201.

The read and determine circuit 201 includes transistors 211 to 216, a comparator CMP, an inverter 221, and an inverter 222. To the read and determine circuit 201, a voltage is supplied through a wiring VDD, a wiring VRef, a wiring VSS, and a wiring VSS2, a control signal is supplied through the wiring BR, a wiring BC, and a wiring BO, and a signal is output to a wiring OL.

A source, a drain, and the gate of the transistor 111 are connected to a wiring VL, the wiring BL, and the wiring BR, respectively. A source, a drain, and a gate of the transistor 112 are connected to a drain of the transistor 211, the wiring BL, and the wiring BC, respectively. A source of the transistor 211 is connected to a gate of the transistor 211 and a first input terminal of the comparator CMP. A source, a drain, and a gate of the transistor 212 are connected to the wiring VDD, the first input terminal of the comparator CMP, and an output terminal of the comparator CMP, respectively. A source, a drain, and a gate of the transistor 213 are connected to the wiring VDD, a wiring ST, and the output terminal of the comparator CMP, respectively. A source, a drain, and a gate of the transistor 214 are connected to the wiring VSS, the wiring ST, and the wiring BO, respectively. A source, a drain, and a gate of the transistor 215 are connected to the wiring VSS2, the wiring OL, and the wiring BO, respectively. A source, a drain, and a gate of the transistor 216 are connected to the wiring VSS2, an input terminal of the inverter 221, and the wiring ST, respectively. An output terminal of the inverter 221 is connected to the wiring OL. An input terminal and an output terminal of the inverter 222 are connected to the wiring OL and the input terminal of the inverter 221, respectively.

A second input terminal of the comparator is connected to the wiring Vref. Note that the inverter 221 and the inverter 222 constitute a latch circuit that holds data of the wiring OL. When the gate of the transistor 215 becomes at "H," the latch circuit is reset, that is, the wiring OL becomes at "L." When the gate of the transistor 216 becomes at "H," the latch circuit is set, that is, the wiring OL becomes at "H."

The aforementioned configurations allow the read and determine circuit 201 to determine the timing when the current Ib supplied through the wiring BL becomes equal to the current Id flowing through the transistor 111.

Figure 2:
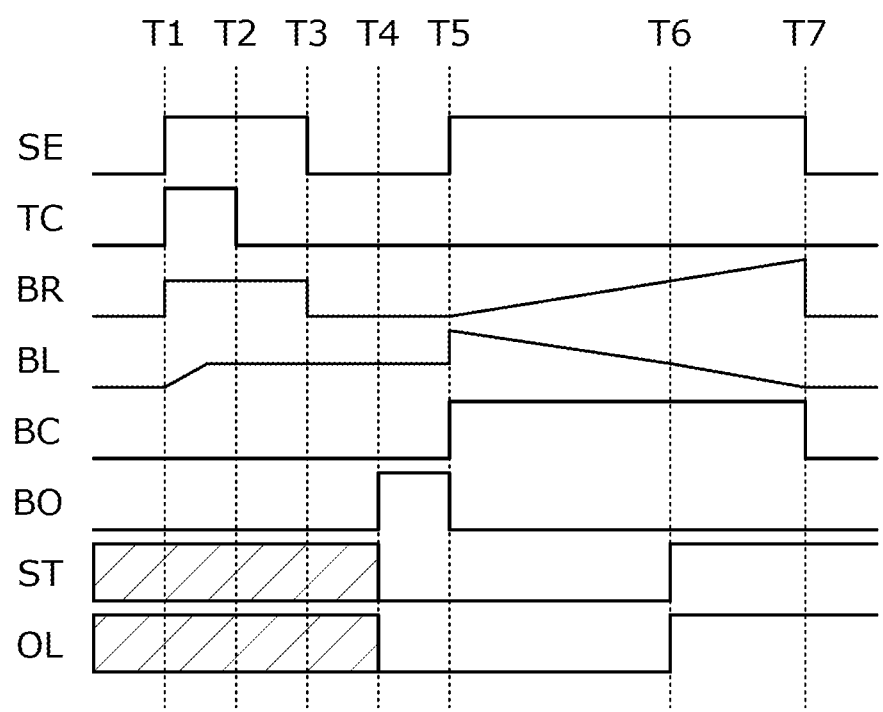
FIG. 2 is a timing chart showing an operation example of a memory cell and a write/read circuit.

FIG. 2 is the timing chart showing an operation example of the memory cell 100 and the write/read circuit 200. Here, high voltages are applied to the wiring VH and the wiring VT; and low voltages are applied to the wiring VL, the wiring VSS, and the wiring VSS2; and an adjusting voltage is applied to the wiring VRef.

In FIG. 2, data writing to the memory cell 100 is performed in a period from Time T1 to Time T3. In a period from Time T1 to Time T2, the wiring SE is set at "H," the wiring TC is set at "H," and the wiring BR is set at a writing voltage corresponding to write data. Here, the writing voltage refers to a voltage uniquely corresponding to write data.

Specifically, a D/A converter preferably generates the writing voltage by receiving multibit write data. Note that the voltage of the wiring BR is set such that the transistor 111 operates in a saturation region.

In this case, the voltage of the second terminal of the capacitor 104 is the voltage of the wiring VT. In the case where the current Ia flowing through the transistor 101 is higher than the current Id flowing through the transistor 111, the voltage of the first terminal of the capacitor 104 increases and when the current Ia flowing through the transistor 101 becomes equal to the current Id flowing through the transistor 111, the voltage of the first terminal of the capacitor 104 becomes constant.

That is, the voltage of the capacitor 104 becomes constant and corresponds to the gate voltage of the transistor 111, that is, the writing voltage.

In a period from Time T2 to Time T3, the wiring SE is set at "H," the wiring TC is set at "L," and the wiring BR is set at the writing voltage. In the period, the capacitor 104 retains a voltage.

In a period from Time T4 to Time T7, data reading from the memory cell 100 is performed.

In a period from Time T4 to Time T5, the wiring BO is set at "H." At this time, the wiring ST is set at "L" and the wiring OL is reset at "L."

In a period from Time T5 to Time T7, the wiring SE is set at "H," the wiring BC is set at "H," and the wiring BO is set at "L," and the voltage of the wiring BR is gradually boosted from a low level to a high level. Note that the voltage of the wiring BR is set such that the transistor 111 operates in a saturation region.

In a period from Time T5 to Time T6, the voltage of the wiring BR is set lower than the writing voltage. Here, the current Id flowing through the transistor 111 is lower than the current Ia flowing through the transistor 101. Thus, the voltage of the wiring BL is increased, so that a current is not supplied to the transistor 211, the voltage of the first input terminal of the comparator CMP is increased, and the comparator CMP outputs "H." That is to say, the transistor 212 and the transistor 213 have low current supply capability, and the wiring ST remains at "L." The wiring OL also remains at "L."

In a period from Time T6 to Time T7, the voltage of the wiring BR is set higher than the writing voltage. Here, the current Id flowing through the transistor 111 is higher than the current Ia flowing through the transistor 101. Thus, a difference between the current the current Id and the current Ia flows through the transistor 112 and the transistor 211, so that the voltage of the first input terminal of the comparator CMP is decreased and the comparator CMP outputs "L." That is to say, the current supply capability of the transistor 212 and the transistor 213 is increased, and the wiring ST becomes at "H." Furthermore, the wiring OL is set at "H."

Note that decrease in the current difference in the period from Time T6 to Time T7 increases the voltage of the first input terminal of the comparator CMP, and the comparator CMP outputs "H." After that, an insufficient current flows through the transistor 112 and the transistor 211 while the comparator CMP alternately outputs "L" and "H." Thus, in the period from Time T6 to Time T7, the state of the wiring ST is alternately switched between "H" and a floating state;

however, the wiring ST remains at substantially "H" owing to the parasitic capacitance or storage capacitance of the wiring ST. The wiring OL is kept at "H" once the wiring ST becomes at "H."

Time T6 is the timing when the state of the wiring OL is switched from "L" to "H" and the timing when the voltage of the wiring BR becomes equal to the writing voltage. That is, data written to the memory cell 100 can be acquired from the voltage of the wiring BR.

This embodiment can be implemented in an appropriate combination with any of the structures described in the other embodiments.

Embodiment 2

Figure 4:
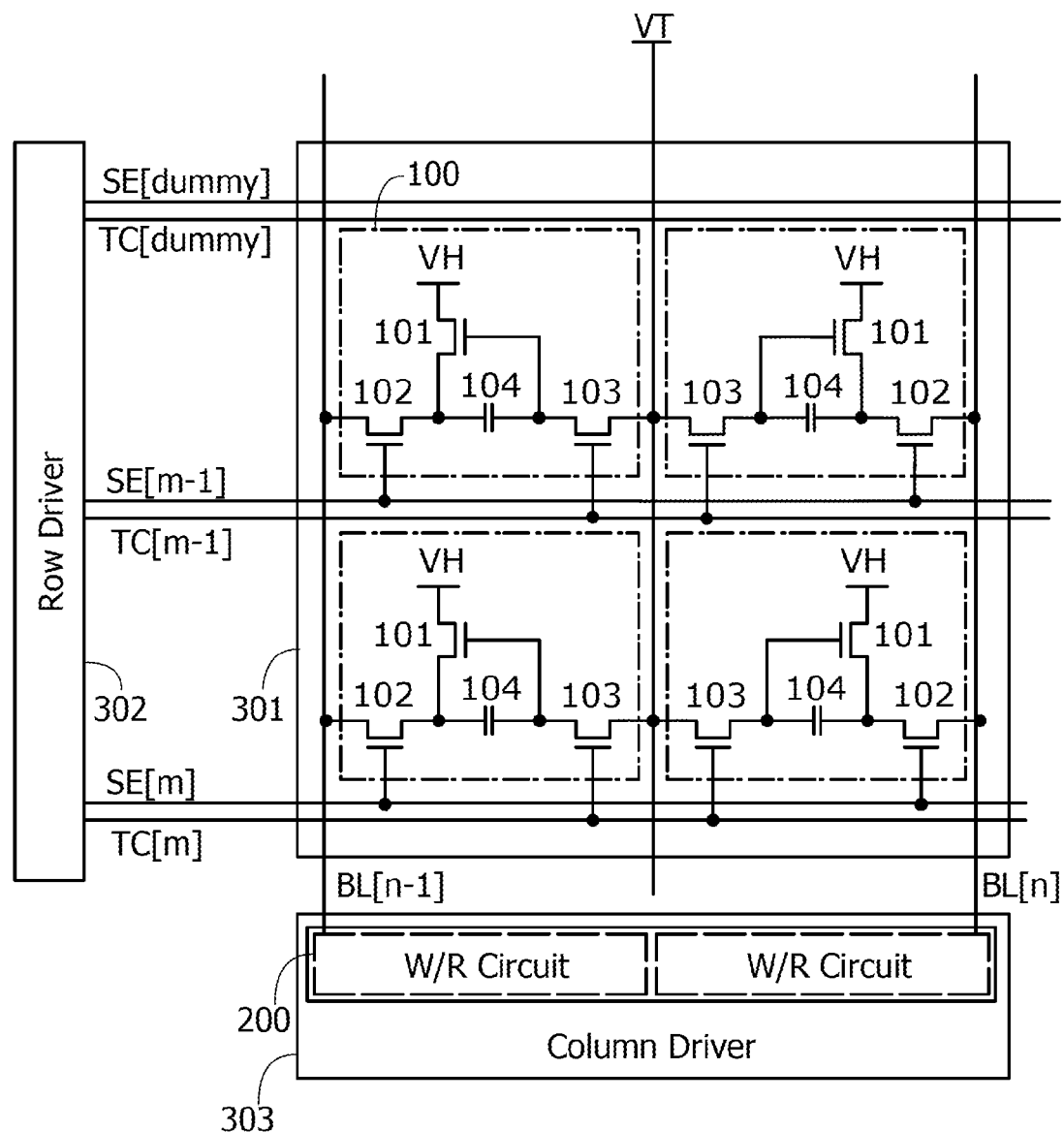
FIG. 4 is a block diagram illustrating a configuration example of a semiconductor device.

In this embodiment, an example of a semiconductor device including the memory cell described in Embodiment 1 will be described.
<Configuration Example of Semiconductor Device>
FIG. 4 is a block diagram illustrating a configuration example of a semiconductor device.

A semiconductor device 300 illustrated in FIG. 4 includes a memory cell array 301, a row driver 302, and a column driver 303.

The memory cell array 301 is provided with a plurality of memory cells 100, a plurality of wirings SE, a plurality of wirings TC, a plurality of wirings BL, and a plurality of wirings VT. The memory cells 100 are arranged in a matrix of m rows and n columns (m and n are integers of 2 or more). There are typically illustrated in FIG. 4 four memory cells 100, a wiring SE[m−1] as a word select line for an (m−1)-th row, a wiring TC[m−1] as a word control line for an (m−1)-th row, a wiring SE[m] as a word select line for an m-th row, a wiring TC[m] as a word control line for an m-th row, a wiring BL[n−1] as a bit line for an (n−1)-th column, a wiring BL[n] as a bit line for an n-th column, and a wiring VT. Furthermore, dummy wirings may be provided at an end of the memory so that each memory cell has equal parasitic capacitance, and a wiring SE[dummy] and a wiring TC[dummy] are also illustrated. For the configuration and operation of the memory cell 100, description in Embodiment 1 can be referred to.

Note that the memory cell array 301 illustrated in FIG. 4 has a configuration in which the wiring VT is shared by the adjacent memory cells 100. With such a configuration, the area occupied by the wiring VT is reduced. Thus, the semiconductor device with the configuration can have high storage capacity per unit area.

The row driver 302 is a circuit having a function of controlling on/off of the transistor 102 in the memory cell 100 connected to the wiring SE as a word select line for a corresponding row address value, in data writing and in data reading, and a function of controlling on/off of the transistor 103 in the memory cell 100 connected to the wiring TC as a word control line for a corresponding row address value, in data writing. With the row driver 302, the memory cells 100 can be selected row by row, and data can be written to and read out from the selected memory cells 100 in the semiconductor device 300.

A column driver 303 includes the write/read circuit 200 illustrated in FIGS. 1A and 1B. In the example of FIG. 4, the write/read circuit 200 is provided for each column (each wiring BL). The column driver 303 is a circuit having a function of writing and reading data to and from n memory cells 100 in a row selected by the row driver 302. With the column driver 303, the memory cells 100 in a given column can be selected, and data can be written to and read out from the selected memory cells 100 in the semiconductor device 300.
<Configuration Example of Row Driver>
FIG. 5 is a block diagram illustrating a configuration example of the row driver 302 in FIG. 4.

Figure 5:
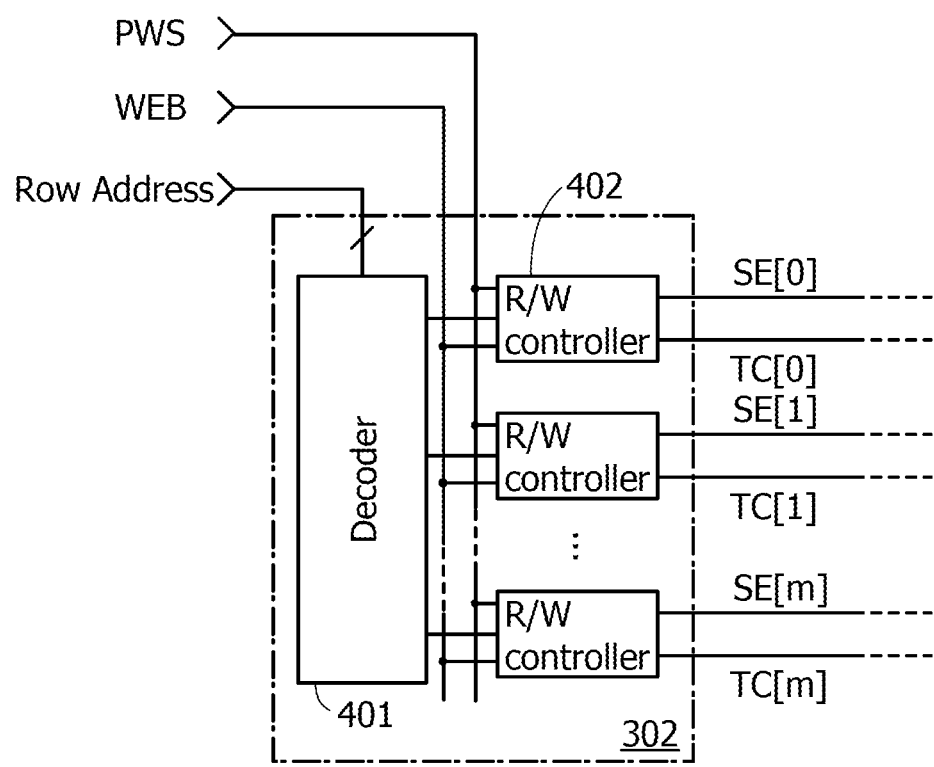
FIG. 5 is a circuit block diagram illustrating an example of a row driver.

The row driver 302 illustrated in FIG. 5 includes a decoder 401 and read/write control circuits 402. The read/write control circuit 402 in each row is connected to the decoder 401. Furthermore, the read/write control circuit 402 in each row is connected to the wiring SE as a word select line and the wiring TC as a word control line.

The decoder 401 is a circuit having a function of outputting a signal for selecting a row provided with the wiring SE as a word select line and the wiring TC as a word control line. Specifically, the decoder 401 is a circuit that receives a row address signal from a wiring RowAddress and selects the read/write control circuit 402 in any of rows in accordance with the row address signal. With the decoder 401, the row driver 302 can select a given row to perform writing and reading of data.

The read/write control circuit 402 is a circuit having a function of outputting a word select signal and a word control signal for a row selected by the decoder 401. Specifically, the read/write control circuit 402 specified by the decoder 401 in accordance with a signal input from the wiring RowAddress outputs a word select signal and/or a word control signal in accordance with a write control signal input from a wiring WEB, a pulse width control signal input from a wiring PWS, and a control signal input from the decoder 401. With the read/write control circuits 402, the row driver 302 can output the word select signal and/or the word control signal for the row selected by the decoder 401.
<Configuration Example of Column Driver>
FIG. 6 is a circuit block diagram illustrating a configuration example of the column driver 303 in FIG. 4.

Figure 6:
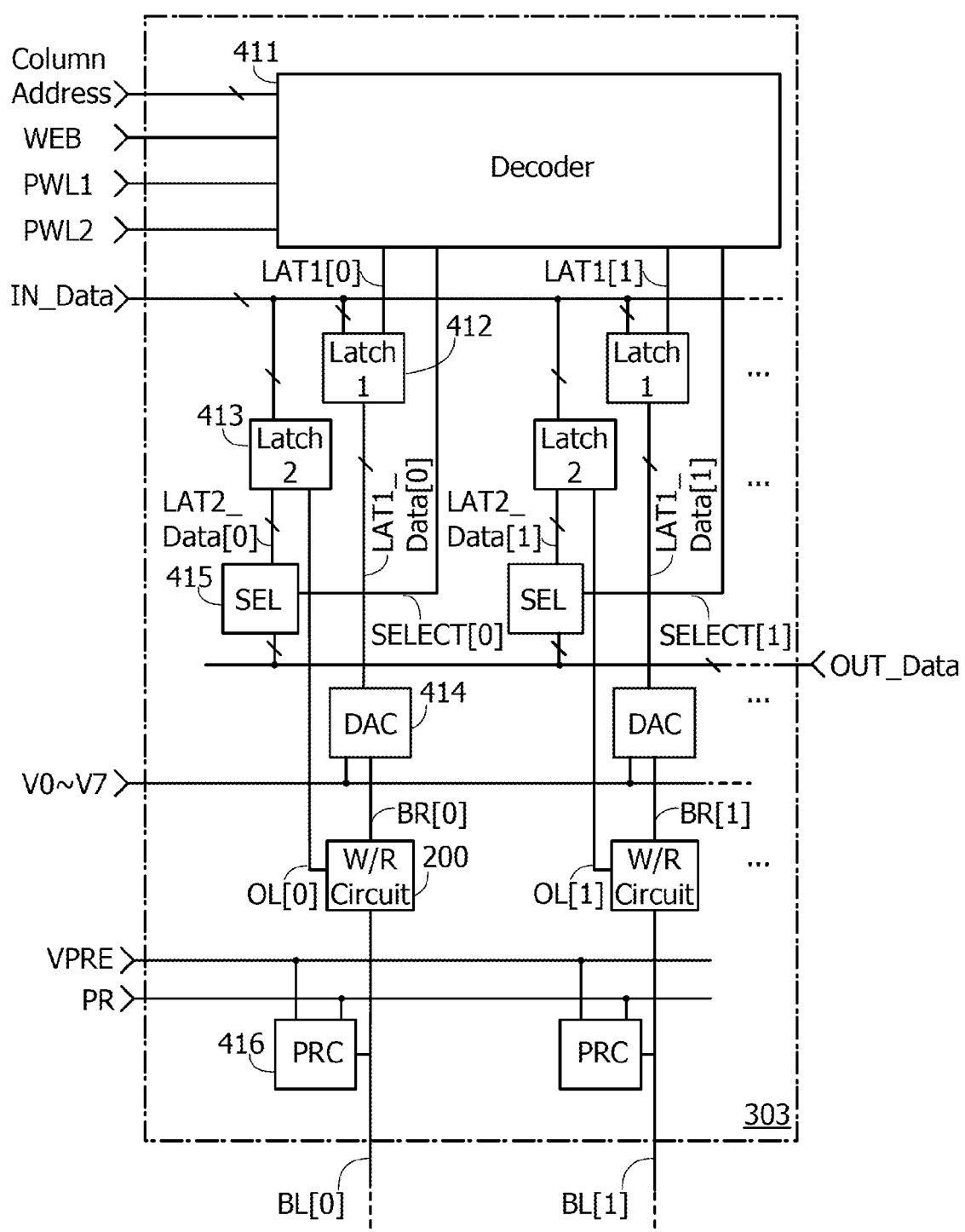
FIG. 6 is a circuit block diagram illustrating an example of a column driver.

The column driver 303 illustrated in FIG. 6 includes a decoder (Decoder) 411, latch 1 circuits (Latch1) 412, latch 2 circuits (Latch2) 413, D/A converters (DAC) 414, selector circuits (SEL) 415, precharge circuits (PRC) 416, and the write/read (W/R) circuits 200. The latch 1 circuit 412, the latch 2 circuit 413, the D/A converter 414, the selector circuit 415, and the write/read circuit 200 are provided for each column. Furthermore, the write/read circuit 200 in each column is connected to the wiring BL as a bit line.

The decoder 411 receives column address signals from a plurality of wirings ColumnAddress, a write control signal from the wiring WEB, and pulse width control signals from a wiring PWL1 and a wiring PWL2 and selects a column in accordance with the column address signal. Specifically, the decoder 411 is a circuit which receives column address signals and pulse width control signals and selects the latch 1 circuit 412 or the selector circuit 415 in any of columns in accordance with the column address signals and the pulse width control signals. With the decoder 411, the column driver 303 can select a given column.

The latch 1 circuit 412 is a circuit having a function of temporarily storing the input data supplied through a plurality of wirings IN_Data. Specifically, the latch 1 circuit 412 is a circuit which receives a select signal from the decoder 411, stores the input data in accordance with the select signal, and outputs the stored data to the D/A converter 414 through the wiring LAT1_Data. With the latch 1 circuit 412, the column driver 303 can store data written at given timing.

The D/A converter 414 is a circuit having a function of converting digital data stored in the latch 1 circuit 412 into an analog voltage corresponding to multilevel data. Specifically, the D/A converter 414 selects any of 8-level potentials from Voltage V0 to Voltage V7 and outputs it to the wiring BR when the number of bits of data input from the latch 1 circuit 412 is 3. With the D/A converter 414, data to be written to the memory cell 100 can be converted into an analog voltage corresponding to multilevel data, in the column driver 303.

The write/read circuit 200 has a function of writing and reading data. In data writing, an analog voltage corresponding to multilevel data is input from the D/A converter 414 to the write/read circuit 200 through the wiring BR. The write/read circuit 200 writes multilevel data corresponding to a multilevel analog voltage input from the wiring BR, to the memory cell 100 selected by the row driver 302. When the current flowing through the transistor 111 in the write/read circuit 200 becomes equal to the current flowing through the transistor 101 in the memory cell, the voltage corresponding to multilevel data is stored in the capacitor 104 in the memory cell 100.

In data reading, the state where the current values of the transistor 111 in the write/read circuit 200 and the transistor 101 in the memory cell are equal to each other is determined, and a latch signal is output from the wiring OL.

The latch 2 circuit 413 receives input data supplied through the plurality of wirings IN_Data and a latch signal from the wiring OL of the write/read circuit 200, and outputs signals from a plurality of wirings LAT2_Data. The latch 2 circuit 413 has a function of storing data supplied through the plurality of wirings IN_Data at the timing of input of a latch signal from the wiring OL of the write/read circuit 200.

In data reading, varied pieces of data are sequentially supplied through the plurality of wirings IN_Data so that coincidence of the data and the value of the memory cell is determined. The latch 2 circuit 413 stores the values of signals of the wirings IN_Data when a latch signal generated by the write/read circuit 200 is input from the wiring OL, and outputs the stored values from the plurality of wirings LAT2_Data. That is, the latch 2 circuit 413 has a function of storing data stored in the memory cell as digital data.

The selector circuit 415 is connected to a select signal line connected to the decoder 411, the plurality of wirings LAT2_Data connected to the latch 2 circuit, and the plurality of wirings OUT_Data. The selector circuit 415 brings the plurality of wirings LAT2_Data and the plurality of wirings OUT_Data into electrical contact when the selector circuit 415 receives data stored in the latch 2 circuit from the plurality of wirings LAT2_Data connected to the latch 2 circuit and a select signal from the decoder 411 is valid.

The precharge circuit 416 is connected to a wiring PR supplied with a precharge control signal, a wiring VPRE supplied with a precharge voltage, and the wiring BL. The wiring BL is provided with the precharge circuit 416 and precharged at an intermediate voltage in the range of the writing voltages, whereby writing time can further be shortened.

Figure 7:
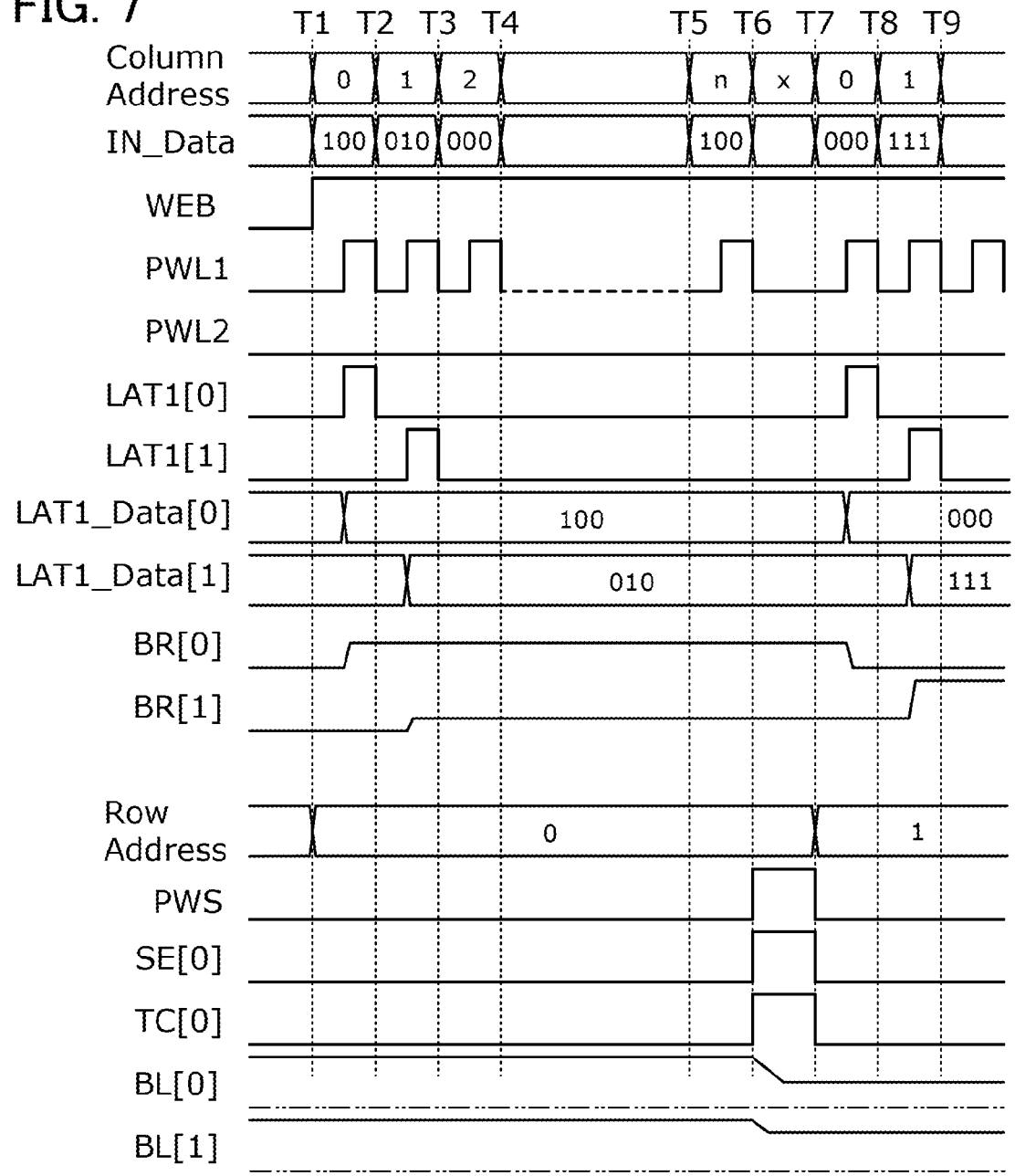
FIG. 7 is a timing chart showing an operation example of a semiconductor device.

FIG. 7 is a timing chart showing an example of the data writing operation of the semiconductor device illustrated in FIGS. 4 to 6.

In FIG. 7, the wiring WEB is at "H"; thus, data writing operation is performed.

In a period from Time T1 to Time T6, a column specified by the column address signal input from the wiring ColumnAddress is selected. A wiring LAT1 for each column selected by the column address signal and is at "H" while the pulse width control signal input to the wiring PWL1 is at "H". Input data of the wiring IN_Data is stored at the timing of a rising pulse of the wiring LAT1 for each column. The stored data of each column keeps being stored until the rising of a pulse of the wiring LAT1 for the next column. Column addresses are sequentially transmitted and input data is transmitted through the wiring IN_Data, whereby data of one row is stored in the latch 1 circuit 412 in each column.

Data stored in the latch 1 circuit 412 in each column is input to the D/A converter 414 in the column and output as a multilevel analog voltage through the wiring BR for the column.

In a period from Time T6 to Time T7, the wirings SE and TC for a row selected by a row address transmitted through the wiring RowAddress of the row driver become at "H", and an analog voltage corresponding to multilevel data is output to the wiring BL of each column from the write/read circuit 200. A voltage corresponding to the multilevel analog voltage is stored in the capacitor 104 in the memory cell 100 connected to the write/read circuit 200.

Figure 8:
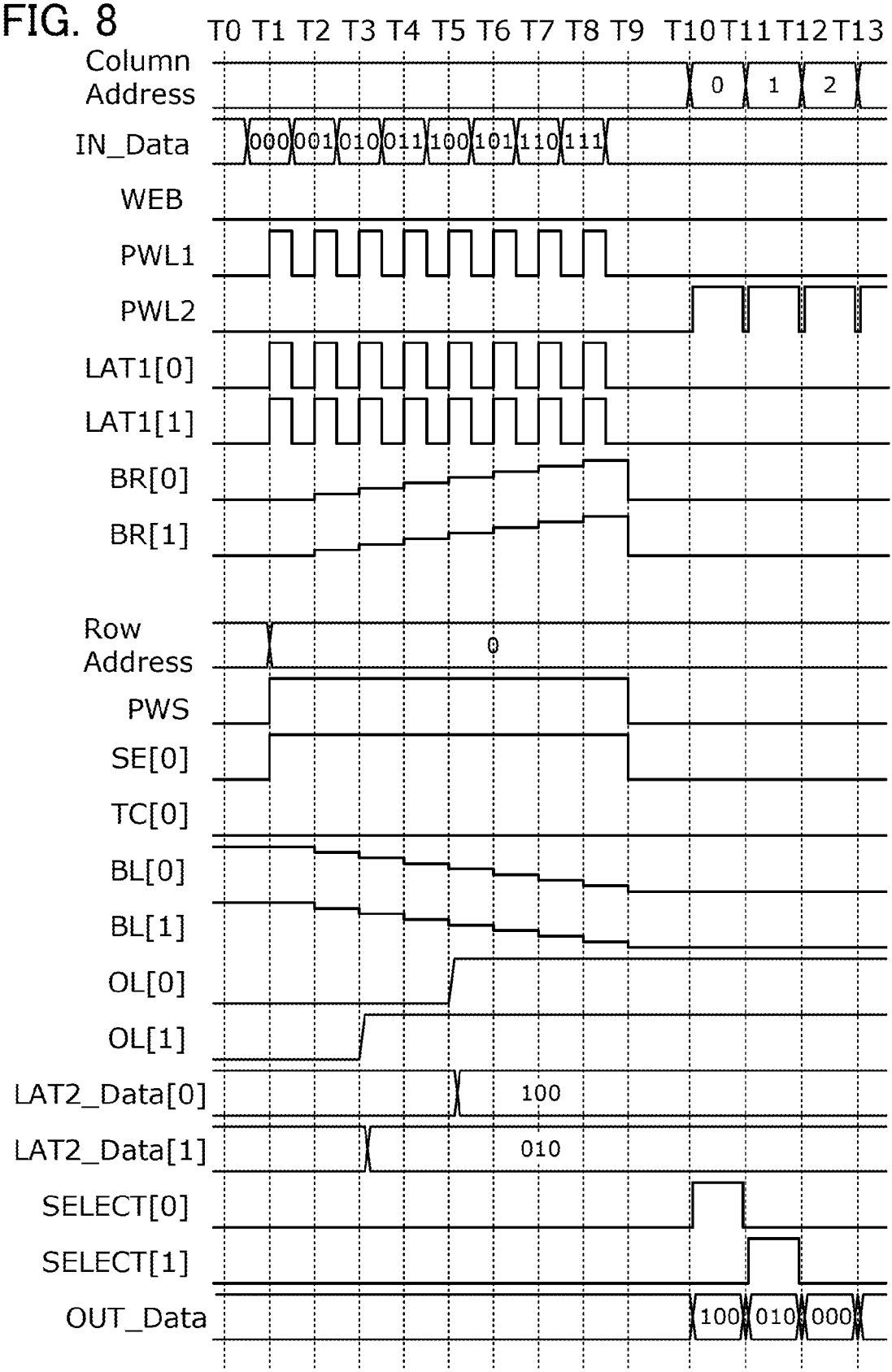
FIG. 8 is a timing chart showing an operation example of a semiconductor device.

FIG. 8 is a timing chart showing an example of the data reading operation of the semiconductor device illustrated in FIGS. 4 to 6.

In FIG. 8, a write control signal input to the wiring WEB is at "L"; thus, data reading operation is performed.

When the wiring WEB is at "L", the latch 1 circuits 412 in all columns operate regardless of a column address signal input to the wiring ColumnAddress. That is, a signal depending on a pulse width control signal input to the wiring PWL1 is transmitted through the wiring LAT1 of the latch 1 circuit 412 in each column.

In a period from Time T0 to Time T9, the value of input data of the wiring IN_Data is sequentially changed to "000", "001", "010", "011", "100", "101", "110", and "111". At rising of pulses of the wirings LAT1 for all columns, input data is stored in all the latch 1 circuits. The data stored in the latch 1 circuits is input to the D/A converters, whereby the voltage output from the D/A converter 414 is raised in stages from a low level to a high level.

Here, data stored in the memory is assumed to be multilevel data corresponding to "100". When the value of data input to the wiring LAT1 connected to an input of the D/A converter 414 is changed from "011" to "100" at Time T5, the current Id flowing through the transistor 111 becomes equal to the current Ib flowing through the wiring BL that corresponds to the data stored in the memory. At that time, the read and determine circuit 201 in the write/read circuit 200 determines the state where the current value is 0, so that the state of OL is switched from "L" to "H".

The latch 2 circuit stores the value data input to the wiring IN_Data, at the timing of rising of OL of the write/read circuit 200. The stored value of data input to the wiring IN_Data is output to the wiring LAT2_Data through which the value stored in the latch 2 circuit is output.

The value of input data of the wiring IN_Data is stored in each latch 2 circuit at the same timing as data stored in the memory cell in each column.

After the time T10, the value stored in each latch 2 circuit is read out. Columns are sequentially selected by column address signals input to the wirings ColumnAddress. A signal obtained by calculating AND of a pulse width control signal input to the wiring PWL2 and a column address select signal is transmitted to a corresponding wiring SELECT.

When each wiring SELECT is at "H", the selector circuit 415 to be connected is selected. The output of the latch 2 circuit, the wiring LAT2_Data, is connected to the wiring OUT_Data through the selector circuit 415, and data is output through the wiring OUT_Data. Consequently, data stored in the memory cell can be read out as digital data.

This embodiment can be implemented in appropriate combination with any of the structures described in the other embodiments.

Embodiment 3

In this embodiment, examples of OS transistors which can be used in the semiconductor device described in Embodiment 1 will be described.

<Structural Example 1 of Transistor>

Figure 9A:
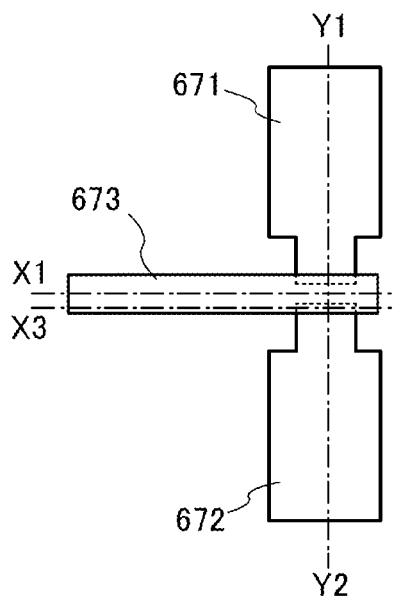
FIGS. 9A to 9D are a top view and cross-sectional views illustrating a structural example of a transistor.
Figure 9B:
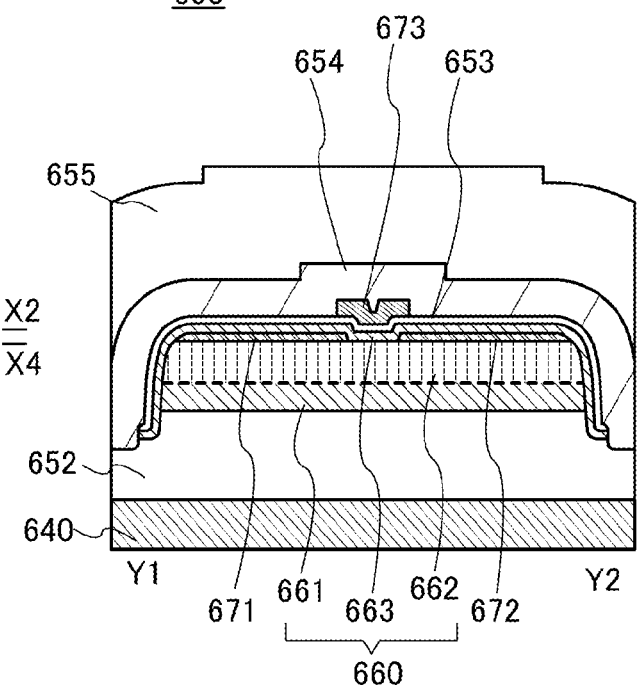
Figure 9C:
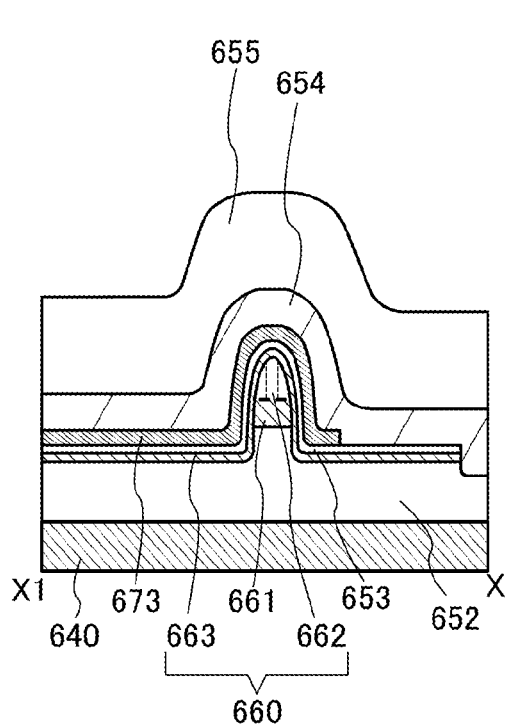
Figure 9D:
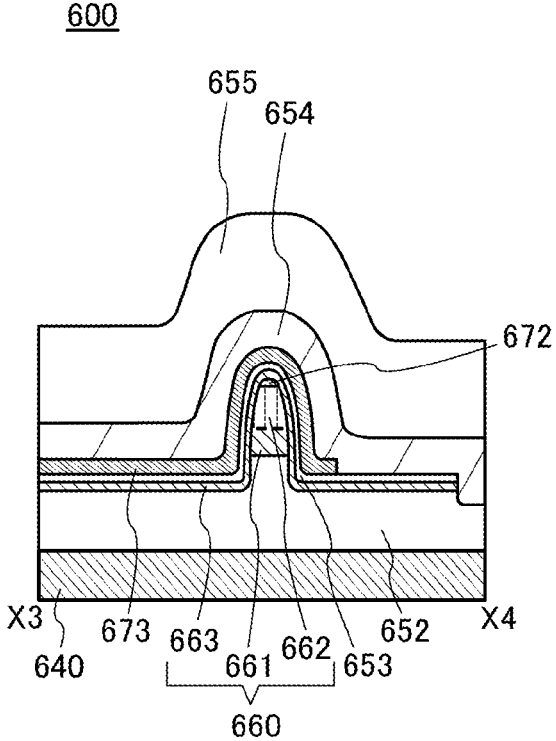

FIGS. 9A to 9D are a top view and cross-sectional views of a transistor 600. FIG. 9A is the top view. FIG. 9B illustrates a cross section along the dashed-dotted line Y1-Y2 in FIG. 9A. FIG. 9C illustrates a cross section along the dashed-dotted line X1-X2 in FIG. 9A. FIG. 9D illustrates a cross section along the dashed-dotted line X3-X4 in FIG. 9A. In FIGS. 9A to 9D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in the top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Unless otherwise specified, an off-state current in this specification refers to a drain current of a transistor in the off state (also referred to as a non-conduction state and a cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on the voltage Vgs in some cases. Thus, "the off-state current of a transistor is lower than or equal to I" may mean "there is a voltage Vgs with which the off-state current of the transistor becomes lower than or equal to I". Furthermore, "the off-state current of a transistor" means "the off-state current in an off state at a predetermined voltage Vgs", "the off-state current in an off state at a voltage Vgs in a predetermined range", "the off-state current in an off state at a voltage Vgs with which sufficiently reduced off-state current is obtained", or the like.

As an example, the assumption is made of an n-channel transistor where the threshold voltage Vth is 0.5 V and the drain current is $1 \times 10^{-9}$ A at a voltage Vgs of 0.5 V, $1 \times 10^{-13}$ A at a voltage Vgs of 0.1 V, $1 \times 10^{-19}$ A at a voltage Vgs of −0.5 V, and $1 \times 10^{-22}$ A at a voltage Vgs of −0.8 V. The drain current of the transistor is $1 \times 10^{-19}$ A or lower at a voltage Vgs of −0.5 V or at a voltage Vgs in the range of −0.8 V to −0.5 V; therefore, it may be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value in relation to the channel width W or by a current value per given channel width (e.g., 1 μm). In the latter case, the off-state current may be represented with a unit meaning current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). The case where the off-state current of the transistor is lower than or equal to I may indicate the existence of a value of Vgs at which the off-state current of the transistor is lower than or equal to I at room temperature, 60° C., 85° C., 95° C., or 125° C., at a temperature where the reliability of a semiconductor device or the like including the transistor is ensured, or at a temperature where the semiconductor device or the like is used (e.g., temperature in the range of 5° C. to 35° C.).

The off-state current of a transistor depends on the voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the reliability of a semiconductor device or the like including the transistor is ensured or Vds used in the semiconductor device or the like including the transistor. The case where the off-state current of the transistor is lower than or equal to I may indicate the existence of Vgs at which the off-state current of the transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds where the reliability of a semiconductor device or the like including the transistor is ensured or Vds used in the semiconductor device or the like including the transistor.

In the above description of the off-state current, a drain may be replaced with a source. That is, the off-state current sometimes refers to a current that flows through a source of a transistor in the off state.

In this specification, the term "leakage current" sometimes expresses the same meaning as an off-state current.

In this specification, the off-state current sometimes refers to a current that flows between a source and a drain when a transistor is off, for example.

The transistor 600 includes a substrate 640, an insulating film 652 over the substrate 640, a semiconductor 661 and a semiconductor 662 stacked in this order over the insulating film 652, a conductive film 671 and a conductive film 672 in contact with the top surface of the semiconductor 662, a semiconductor 663 in contact with the semiconductor 661, the semiconductor 662, the conductive film 671, and the conductive film 672, an insulating film 653 and a conductive film 673 over the semiconductor 663, an insulating film 654 over the conductive film 673 and the insulating film 653, and an insulating film 655 over the insulating film 654. Note that the semiconductor 661, the semiconductor 662, and the semiconductor 663 may be collectively referred to as a semiconductor 660.

The conductive film 671 functions as a source electrode of the transistor 600. The conductive film 672 functions as a drain electrode of the transistor 600. Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

The conductive film 673 functions as a gate electrode of the transistor 600.

The insulating film 653 functions as a gate insulating film of the transistor 600.

As illustrated in FIG. 9C, a side surface of the semiconductor 662 is surrounded by the conductive film 673. With such a structure, the semiconductor 662 can be electrically surrounded by an electric field of the conductive film 673 (a transistor structure in which a semiconductor is electrically surrounded by an electric field of a conductive film (gate electrode) is referred to as a surrounded channel (s-channel) structure). Therefore, a channel is formed in the entire semiconductor 662 (bulk) in some cases. In the s-channel structure, a large amount of current can flow between a source and a drain of a transistor, so that high current in an on state (on-state current) can be achieved. The s-channel structure enables a transistor to operate at high frequency.

Since high on-state current can be obtained, the s-channel structure is suitable for a downsized transistor. A semiconductor device including the downsized transistor can have a high integration degree and high density. For example, the channel length of the transistor is preferably less than or equal to 100 nm, more preferably less than or equal to 60 nm, still more preferably less than or equal to 30 nm. The channel width of the transistor is preferably less than or equal to 100 nm, more preferably less than or equal to 60 nm, still more preferably less than or equal to 30 nm.

Since a high on-state current can be obtained, the s-channel structure is suitable for a transistor that needs to operate at high frequency. A semiconductor device including the transistor can operate at high frequency.

Components of the semiconductor device of this embodiment will be described below in detail.

<<Substrate>>

As the substrate 640, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a single material semiconductor substrate made of silicon, germanium, or the like, a compound semiconductor substrate made of silicon carbide, silicon germanium, gallium arsenide, indium phosphide, zinc oxide, or gallium oxide, or the like is used. The above semiconductor substrate in which an insulator region is provided, e.g., a silicon on insulator (SOI) substrate may also be used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 640. As a method for providing a transistor over a flexible substrate, there is a method in which the transistor is formed over a non-flexible substrate and then the transistor is separated and transferred to the substrate 640 which is a flexible substrate. In that case, a separation layer is preferably provided between the non-flexible substrate and the transistor. As the substrate 640, a sheet, a film, or a foil containing a fiber may be used.

The substrate 640 may have elasticity. The substrate 640 may have a property of returning to its original shape when bending or pulling is stopped. Alternatively, the substrate 640 may have a property of not returning to its original shape. The thickness of the substrate 640 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 640 has a small thickness, the weight of the semiconductor device can be reduced. When the substrate 640 has a small thickness, even in the case of using glass or the like, the substrate 640 may have elasticity or a property of returning to its original shape when bending or pulling is stopped. Therefore, an impact applied to the semiconductor device over the substrate 640, which is caused by dropping or the like, can be reduced. That is, a durable semiconductor device can be provided.

For the substrate 640 which is a flexible substrate, for example, metal, an alloy, resin, glass, or fiber thereof can be used. The flexible substrate 640 preferably has a lower coefficient of linear expansion because deformation due to an environment is suppressed. The flexible substrate 640 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 640 because of its low coefficient of linear expansion.

<<Base Insulating Film>>

It is preferable that the top surface of the insulating film 652 be planarized by a chemical mechanical polishing (CMP) method or the like.

The insulating film 652 preferably includes oxide. In particular, the insulating film 652 preferably includes an oxide material from which part of oxygen is released by heating. The insulating film 652 preferably includes an oxide containing oxygen in excess of that in the stoichiometric composition. Part of oxygen is released by heating from the oxide film containing oxygen in excess of that in the stoichiometric composition. Oxygen released from the insulating film 652 is supplied to the semiconductor 660 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen in excess of that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. As the metal oxide, aluminum oxide, aluminum oxynitride, gallium oxide, gallium oxynitride, yttrium oxide, yttrium oxynitride, hafnium oxide, or hafnium oxynitride can be used. Note that in this specification, "oxynitride" refers to a material that contains oxygen at a higher proportion than nitrogen, and "nitride oxide" refers to a material that contains nitrogen at a higher proportion than oxygen.

In order to make the insulating film 652 contain excess oxygen, oxygen may be introduced into the insulating film 652, whereby a region containing excess oxygen is formed. For example, oxygen (at least including any of oxygen radicals, oxygen atoms, and oxygen ions) may be introduced into the insulating film 652 that has been formed, so that a region containing excess oxygen is formed. Oxygen can be introduced by, for example, an ion implantation method, an ion doping method, a plasma immersion ion implantation method, plasma treatment, or the like.

<Semiconductor>

Next, semiconductors which can be used as the semiconductors 661 to 663 or the like will be described below.

In the transistor 600, it is preferable that a current flowing between a source and drain in an off state (off-state current) be low. An example of a transistor with such a low off-state current is a transistor including an oxide semiconductor as a semiconductor.

The semiconductor 662 is, for example, an oxide semiconductor containing indium (In). The semiconductor 662 has a high carrier mobility (electron mobility) when containing, for example, indium. The semiconductor 662 preferably contains an element M. The element M is preferably aluminum (Al), gallium (Ga), yttrium (Y), tin (Sn), or the like. Other elements which can be used as the element M include boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), and tungsten (W). Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 662 preferably contains zinc (Zn). When the oxide semiconductor contains zinc, the oxide semiconductor is easily crystallized in some cases.

Note that the semiconductor 662 is not limited to the oxide semiconductor containing indium. The semiconductor 662 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 662, an oxide with a wide energy gap may be used. For example, the energy gap of the semiconductor 662 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor 662 is preferably a CAAC-OS film which will be described later.

For example, the semiconductor 661 and the semiconductor 663 include one or more, or two or more elements other than oxygen included in the semiconductor 662. Since the semiconductor 661 and the semiconductor 663 each include one or more, or two or more elements other than oxygen included in the semiconductor 662, an interface state is less likely to be formed at the interface between the semiconductor 661 and the semiconductor 662 and the interface between the semiconductor 662 and the semiconductor 663.

The semiconductor 661, the semiconductor 662, and the semiconductor 663 preferably include at least indium. In the case of using an In-M-Zn oxide as the semiconductor 661, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor 662, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the semiconductor 663, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 663 and the semiconductor 661 may be formed using the same type of oxide. Note that the semiconductor 661 and/or the semiconductor 663 do/does not necessarily contain indium in some cases. For example, the semiconductor 661 and/or the semiconductor 663 may be gallium oxide.

Figure 10A:
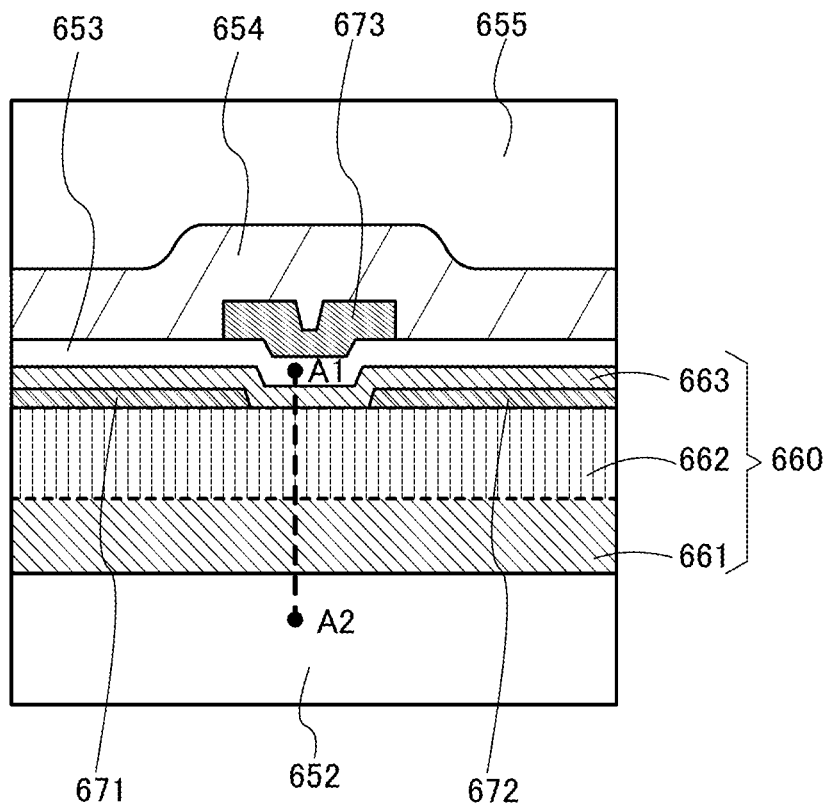
FIGS. 10A and 10B are a cross-sectional view illustrating a structural example of a transistor and a band diagram of the transistor.
Figure 10B:
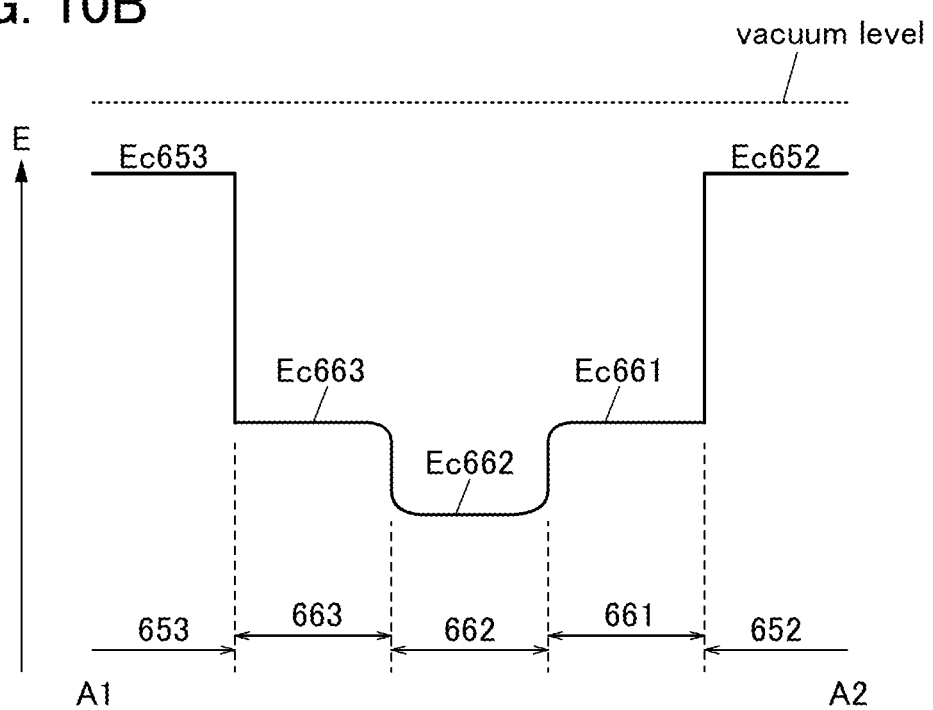

Next, a function and an effect of the semiconductor 660 in which the semiconductor 661, the semiconductor 662, and the semiconductor 663 are stacked will be described using an energy band diagram in FIG. 10B. FIG. 10A is an enlarged view of the channel portion of the transistor 600 illustrated in FIG. 9B. FIG. 10B shows an energy band structure of a portion along the chain line A1-A2 in FIG. 10A. FIG. 10B illustrates the energy band structure of a channel formation region of the transistor 600.

In FIG. 10B, Ec652, Ec661, Ec662, Ec663, and Ec653 indicate the energy of the conduction band minimum of the insulating film 652, the semiconductor 661, the semiconductor 662, the semiconductor 663, and the insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating film 652 and the insulating film 653 are insulators, Ec652 and Ec653 are closer to the vacuum level than Ec661, Ec662, and Ec663 (i.e., the insulating film 652 and the insulating film 653 have a smaller electron affinity than the semiconductor 661, the semiconductor 662, and the semiconductor 663).

As the semiconductor 662, an oxide having an electron affinity higher than those of the semiconductors 661 and 663 is used. For example, as the semiconductor 662, an oxide having an electron affinity higher than those of the semiconductors 661 and 663 by 0.07 eV or higher and 1.3 eV or lower, preferably 0.1 eV or higher and 0.7 eV or lower, more preferably 0.15 eV or higher and 0.4 eV or lower is used.

Note that the electron affinity refers to an energy difference between the vacuum level and the conduction band minimum.

An indium gallium oxide has a small electron affinity and a high oxygen-blocking property. Therefore, the semiconductor 663 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the semiconductor 662 having the highest electron affinity among the semiconductors 661 to 663.

Here, in some cases, there is a mixed region of the semiconductor 661 and the semiconductor 662 between the semiconductor 661 and the semiconductor 662. Furthermore, in some cases, there is a mixed region of the semiconductor 662 and the semiconductor 663 between the semiconductor 662 and the semiconductor 663. The mixed region has a low interface state density. For that reason, the stack of the semiconductor 661, the semiconductor 662, and the semiconductor 663 has a band structure where energy at each interface and in the vicinity of the interface is changed continuously (continuous junction).

At this time, electrons move mainly in the semiconductor 662, not in the semiconductor 661 and the semiconductor 663. As described above, when the interface state density at the interface between the semiconductor 661 and the semiconductor 662 and the interface state density at the interface between the semiconductor 662 and the semiconductor 663 are decreased, electron movement in the semiconductor 662 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness in a channel formation region is large.

To increase the on-state current of the transistor, for example, root mean square (RMS) roughness with a measurement area of 1 μm×1 μm of the top surface or the bottom surface of the semiconductor 662 (a formation surface; here, the semiconductor 661) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using, for example, a scanning probe microscope SPA-500 manufactured by SII Nano Technology Inc.

The electron movement is also inhibited, for example, in the case where the density of defect states is high in a region where a channel is formed.

For example, in the case where the semiconductor 662 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 662, the on-state current of the transistor can be increased in some cases.

For example, the hydrogen concentration at a certain depth in the semiconductor 662 or in a certain region of the semiconductor 662, which is measured by secondary ion mass spectrometry (SIMS), is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

To decrease oxygen vacancies in the semiconductor 662, for example, there is a method in which excess oxygen in the insulating film 652 is moved to the semiconductor 662 through the semiconductor 661. In this case, the semiconductor 661 is preferably a layer having an oxygen-transmitting property (a layer through which oxygen passes or is transmitted).

In the case where the transistor has an s-channel structure, a channel is formed in the whole of the semiconductor 662. Therefore, as the semiconductor 662 has a larger thickness, a channel region becomes larger. In other words, the thicker the semiconductor 662 is, the larger the on-state current of the transistor is. For example, the semiconductor 662 has a region with a thickness of greater than or equal to 10 nm, preferably greater than or equal to 20 nm, more preferably greater than or equal to 40 nm, still more preferably greater than or equal to 60 nm, yet still more preferably greater than or equal to 100 nm. Note that the semiconductor 662 has a region with a thickness of, for example, less than or equal to 300 nm, preferably less than or equal to 200 nm, more preferably less than or equal to 150 nm, otherwise the productivity of the semiconductor device might be decreased. In some cases, when the channel formation region is reduced in size, the electrical characteristics of the transistor with a smaller thickness of the semiconductor 662 are higher than those of the transistor with a larger thickness of the semiconductor 662. Therefore, the semiconductor 662 may have a thickness less than 10 nm.

Moreover, the thickness of the semiconductor 663 is preferably as small as possible to increase the on-state current of the transistor. For example, the semiconductor 663 has a region with a thickness of less than 10 nm, preferably less than or equal to 5 nm, more preferably less than or equal to 3 nm. Meanwhile, the semiconductor 663 has a function of blocking entry of elements other than oxygen (such as hydrogen and silicon) included in the adjacent insulator into the semiconductor 662 where a channel is formed. For this reason, it is preferable that the semiconductor 663 have a certain thickness. For example, the semiconductor 663 may have a region with a thickness of greater than or equal to 0.3 nm, preferably greater than or equal to 1 nm, more preferably greater than or equal to 2 nm. The semiconductor 663 preferably has an oxygen blocking property to suppress outward diffusion of oxygen released from the insulating film 652 and the like.

To improve reliability, preferably, the thickness of the semiconductor 661 is large and the thickness of the semiconductor 663 is small. For example, the semiconductor 661 has a region with a thickness of greater than or equal to 10 nm, preferably greater than or equal to 20 nm, more preferably greater than or equal to 40 nm, still more preferably greater than or equal to 60 nm. When the thickness of the semiconductor 661 is made large, the distance from an interface between the adjacent insulator and the semiconductor 661 to the semiconductor 662 in which a channel is formed can be large. However, to prevent the productivity of the semiconductor device from being decreased, the semiconductor 661 has a region with a thickness of, for example, less than or equal to 200 nm, preferably less than or equal to 120 nm, more preferably less than or equal to 80 nm.

For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS analysis is provided between the semiconductor 662 and the semiconductor 661. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor 662 and the semiconductor 663.

It is preferable to reduce the concentration of hydrogen in the semiconductor 661 and the semiconductor 663 in order to reduce the concentration of hydrogen in the semiconductor 662. The semiconductor 661 and the semiconductor 663 each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor 661 and the semiconductor 663 in order to reduce the concentration of nitrogen in the semiconductor 662. The semiconductor 661 and the semiconductor 663 each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The above three-layer structure is an example. For example, a two-layer structure without the semiconductor 661 or the semiconductor 663 may be employed. A four-layer structure in which any one of the semiconductors described as examples of the semiconductor 661, the semiconductor 662, and the semiconductor 663 is provided under or over the semiconductor 661 or under or over the semiconductor 663 may be employed. An n-layer structure (n is an integer of 5 or more) in which any one of the semiconductors described as examples of the semiconductor 661, the semiconductor 662, and the semiconductor 663 is provided at two or more of the following positions: over the semiconductor 661, under the semiconductor 661, over the semiconductor 663, and under the semiconductor 663.

When the semiconductors 661 to 663 have the above structures, the transistor 600 can have a high on-state current and operate at high frequency.

<<Conductive Film>>

The conductive films 671 to 673 preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive films are preferably formed using a low-resistance conductive material such as aluminum or copper. The conductive films are more preferably formed using a Cu—Mn alloy, in which case manganese oxide formed at the interface with an insulator containing oxygen has a function of preventing Cu diffusion.

The conductive films 671 to 673 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a layered structure formed using the above light-transmitting conductive material and the above metal element.

The conductive films 671 to 673 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Gate Insulating Film>>

The insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 653 may be a stack including any of the above materials. The insulating film 653 may contain lanthanum (La), nitrogen, or zirconium (Zr) as an impurity.

An example of a layered structure of the insulating film 653 is described. The insulating film 653 contains oxygen, nitrogen, silicon, or hafnium, for example. Specifically, the insulating film 653 preferably includes hafnium oxide and silicon oxide or silicon oxynitride.

Hafnium oxide has a higher dielectric constant than silicon oxide and silicon oxynitride. Therefore, the thickness of the insulating film 653 can be made large as compared with the case where silicon oxide is used; as a result, a leakage current due to a tunnel current can be low. That is, it is possible to provide a transistor with a low off-state current.

<<Protective Insulating Film>>

The insulating film 654 has a function of blocking oxygen, hydrogen, water, alkali metal, alkaline earth metal, and the like. Providing the insulating film 654 can prevent outward diffusion of oxygen from the semiconductor 660 and entry of hydrogen, water, or the like into the semiconductor 660 from the outside. The insulating film 654 can be, for example, a nitride insulating film. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 654 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the semiconductor 660, preventing release of oxygen, which is the main component of the semiconductor 660, from the oxide semiconductor, and preventing unnecessary release of oxygen from the insulating film 652. In addition, oxygen contained in the aluminum oxide film can be diffused into the oxide semiconductor.

<<Interlayer Insulating Film>>

The insulating film 655 is preferably formed over the insulating film 654. The insulating film 655 can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 655, an organic resin such as a polyimide resin, a polyamide resin, an acrylic resin, a siloxane resin, an epoxy resin, or a phenol resin can be used. The insulating film 655 may be a stack including any of the above materials.

<<Structure of Oxide Semiconductor Film>>

A structure of an oxide semiconductor that can be used as the semiconductor 662 will be described below.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

In this specification, trigonal and rhombohedral crystal systems are included in a hexagonal crystal system.

The structure of the oxide semiconductor film will be described below.

An oxide semiconductor film is classified into a single crystal oxide semiconductor film and a non-single-crystal oxide semiconductor film. Alternatively, an oxide semiconductor is classified into a crystalline oxide semiconductor and an amorphous oxide semiconductor, for example.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. Examples of the crystalline oxide semiconductor include a single crystal oxide semiconductor, a CAAC-OS, a polycrystalline oxide semiconductor, and a microcrystalline oxide semiconductor.

First, a CAAC-OS film will be described.

A CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in the direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

On the other hand, according to the plan high-resolution TEM image of the CAAC-OS film observed in the direction substantially perpendicular to the sample surface, metal atoms are arranged in a triangular or hexagonal arrangement in the crystal parts. However, there is no regularity of arrangement of metal atoms between different crystal parts.

For example, when the structure of a CAAC-OS including an $InGaZnO_4$ crystal is analyzed by an out-of-plane method using an X-ray diffraction (XRD) apparatus, a peak may appear at a diffraction angle (2θ) of around 31°. This peak is derived from the (009) plane of the $InGaZnO_4$ crystal, which indicates that crystals in the CAAC-OS film have c-axis alignment, and that the c-axes are aligned in the direction substantially perpendicular to the formation surface or the top surface of the CAAC-OS film.

Note that in analysis of the CAAC-OS film by an out-of-plane method, another peak may appear when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film with low impurity concentration. The impurity is an element other than the main components of the oxide semiconductor film, such as hydrogen, carbon, silicon, or a transition metal element. In particular, an element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor might serve as a carrier trap or a carrier generation source.

The CAAC-OS film is an oxide semiconductor having a low density of defect states. In some cases, oxygen vacancies in the oxide semiconductor film serve as carrier traps or serve as carrier generation sources when hydrogen is captured therein, for example.

The state in which impurity concentration is low and density of defect states is low (the number of oxygen vacancies is small) as in the CAAC-OS film is referred to as a "highly purified intrinsic" or "substantially intrinsic" state. A highly purified intrinsic or substantially intrinsic oxide semiconductor has few carrier generation sources, and thus can have a low carrier density. Therefore, a transistor including the oxide semiconductor film rarely has negative threshold voltage (is rarely normally on). The highly purified intrinsic or substantially intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

Note that in this specification and the like, the carrier density of a substantially intrinsic oxide semiconductor film is lower than $1\times10^{17}/cm^3$, lower than $1\times10^{15}/cm^3$, or lower than $1\times10^{13}/cm^3$. With a highly purified intrinsic oxide semiconductor film, the transistor can have stable electric characteristics.

In order to make the oxide semiconductor film intrinsic or substantially intrinsic, for example, the concentration of silicon at a certain depth of the oxide semiconductor film or in a certain region of the oxide semiconductor film, which is measured by SIMS, is lower than $1\times10^{19}$ atoms/cm$^3$, preferably lower than $5\times10^{18}$ atoms/cm$^3$, more preferably lower than $1\times10^{18}$ atoms/cm$^3$. Furthermore, the concentration of hydrogen at a certain depth of the oxide semiconductor film or in a certain region of the oxide semiconductor film is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. Moreover, the concentration of nitrogen at a certain depth of the oxide semiconductor film or in a certain region of the oxide semiconductor film is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In addition, in the case where the oxide semiconductor film includes a crystal, the crystallinity of the oxide semiconductor film might be decreased if silicon or carbon is included at high concentration. In order not to lower the crystallinity of the oxide semiconductor film, for example, the concentration of silicon at a certain depth of the oxide semiconductor film or in a certain region of the oxide semiconductor film is lower than $1\times10^{19}$ atoms/cm$^3$, preferably lower than $5\times10^{18}$ atoms/cm$^3$, more preferably lower than $1\times10^{18}$ atoms/cm$^3$. Furthermore, the concentration of carbon at a certain depth of the oxide semiconductor film or in a certain region of the oxide semiconductor film is lower than $1\times10^{19}$ atoms/cm$^3$, preferably lower than $5\times10^{18}$ atoms/cm$^3$, more preferably lower than $1\times10^{18}$ atoms/cm$^3$, for example.

With the use of the CAAC-OS film in a transistor, variation in the electrical characteristics of the transistor due to irradiation with visible light or ultraviolet light is small.

Next, a microcrystalline oxide semiconductor will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not ordered. Accordingly, the nc-OS film cannot be distinguished from an amorphous oxide semiconductor film, depending on an analysis method. For example, when the nc-OS film is subjected to structural analysis by an out-of-plane method with an XRD apparatus using an X-ray having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Even when the oxide semiconductor film is a CAAC-OS film, a diffraction pattern similar to that of an nc structure or the like is partly observed in some cases. Therefore, whether or not a CAAC-OS film is favorable can be determined by the proportion of a region where a diffraction pattern of a CAAC-OS film is observed in a predetermined area (also referred to as CAAC proportion). The CAAC proportion is preferably higher than or equal to 90%, more preferably higher than or equal to 95%, still more preferably higher than or equal to 97% and lower than or equal to 100%.

Next, an amorphous oxide semiconductor film will be described.

The amorphous oxide semiconductor film is an oxide semiconductor film having disordered atomic arrangement and no crystal part and exemplified by an oxide semiconductor film that exists in an amorphous state, such as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak that shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. The growth of the crystal part occurs due to the crystallization of the a-like OS film, which is induced by a slight amount of electron beam employed in the TEM observation. In contrast, in the nc-OS film that have good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film depends on the structure in some cases. For example, when the composition of an oxide semiconductor film is determined, the structure of the oxide semiconductor film can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of the single crystal oxide semiconductor film.

Specific examples of the above description will be given. For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor film having a certain composition cannot exist in a single crystal structure. In that case, single crystal oxide semiconductor films with different compositions are combined at an adequate ratio, which makes it possible to calculate density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

Note that an oxide semiconductor film may be a stack including two or more of an amorphous oxide semiconductor film, an a-like OS film, a microcrystalline oxide semiconductor film, and a CAAC-OS film, for example.

The composition of a CAAC-OS will be described below. For explanation of the composition, the case of an In-M-Zn oxide that is an oxide semiconductor to be a CAAC-OS is described as an example. The element M is aluminum, gallium, yttrium, tin, or the like. Other elements which can be used as the element M include boron, silicon, titanium, iron, nickel, germanium, zirconium, molybdenum, lanthanum, cerium, neodymium, hafnium, tantalum, and tungsten.

Figure 11:
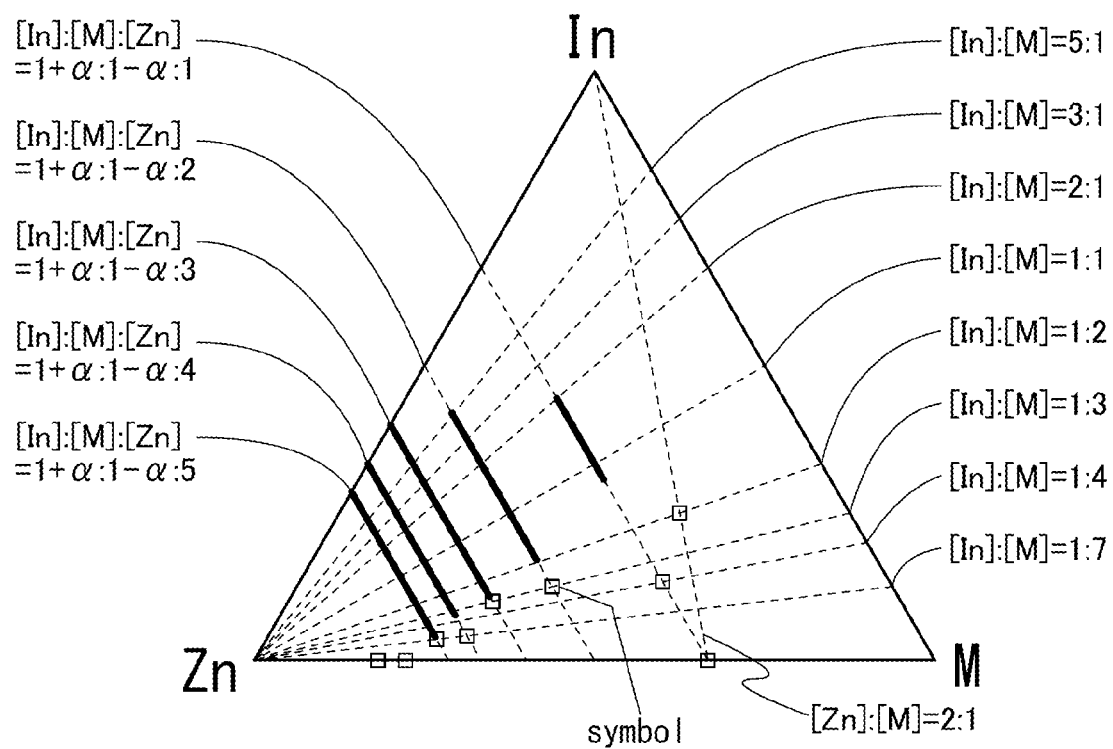
FIG. 11 is a ternary diagram showing the composition of an In-M-Zn oxide.

FIG. 11 is a ternary diagram whose vertices represent In, M, and Zn. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)_m$ (m is a natural number). Since In and M can be interchanged, the crystal can also be represented by $In_{1+\alpha}M_{1-\alpha}O_3(ZnO)_m$. This composition is represented by any of the dashed lines denoted as $[In]:[M]:[Zn]=1+\alpha:1-\alpha:1$, $[In]:[M]:[Zn]=1+\alpha:1-\alpha:2$, $[In]:[M]:[Zn]=1+\alpha:1-\alpha:3$, $[In]:[M]:[Zn]=1+\alpha:1-\alpha:4$, and $[In]:[M]:[Zn]=1+\alpha:1-\alpha:5$ in FIG. 11.

It is known that thick lines on the dashed lines in FIG. 11 indicate compositions which allow a single-phase solid solution range when oxides (raw materials) are mixed and sintered at 1350° C., for example. Coordinates denoted by square symbols in FIG. 11 correspond to known compositions with which a spinel crystal structure is likely to be mixed.

For example, a compound represented by $ZnM_2O_4$, such as $ZnGa_2O_4$, is known as a compound having a spinel crystal structure, for example. When a composition is in the neighborhood of $ZnM_2O_4$ as illustrated in FIG. 11, that is, the ratio of In to Zn and M is close to 0:1:2, a spinel crystal structure is likely to be formed or mixed. Furthermore, it is preferable that the CAAC-OS have no spinel crystal structure in particular.

In addition, to increase carrier mobility, the indium content is preferably increased. In an oxide semiconductor containing indium, the element M, and zinc, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby carrier mobility can be increased.

Accordingly, the composition of the semiconductor 662 in FIGS. 9A to 9D is preferably in the neighborhood of the composition represented by the bold line in FIG. 11. When these compositions are employed, the channel formation region can have a high proportion of CAAC. Furthermore, in the case where the indium content in the semiconductor 662 is increased, the on-state current of the transistor can be increased.

When the channel formation region of the transistor includes a CAAC-OS as described above, a transistor having high reliability and high on-state current can be provided. In addition, a transistor capable of operating at high frequency can be provided.

When a CAAC-OS is deposited by a sputtering method, because of heating of a substrate surface (the surface on which the CAAC-OS is deposited), space heating, or the like, the composition of the film is sometimes different from that of a target as a source or the like. For example, since zinc oxide sublimates more easily than indium oxide, gallium oxide, or the like, the source and the film are likely to have different compositions. Thus, a source is preferably selected taking into account the change in composition. Note that a difference between the compositions of the source and the film is also affected by a pressure or a gas used for the deposition as well as a temperature.

In the case where the CAAC-OS is deposited by a sputtering method, a target including a polycrystalline structure is preferably used.

<Structural Example 2 of Transistor>

Figure 12A:
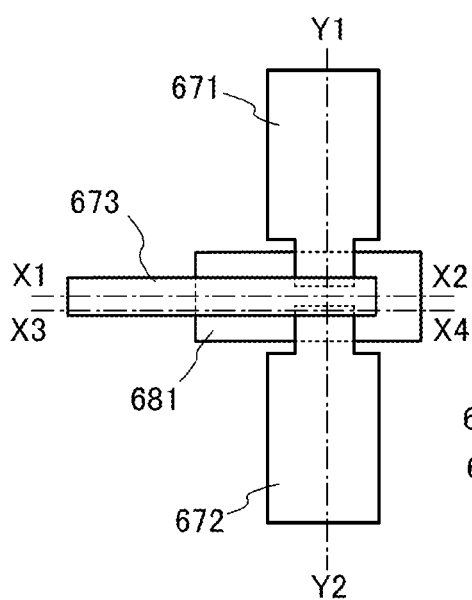
FIGS. 12A to 12D are a top view and cross-sectional views illustrating a structural example of a transistor.
Figure 12B:
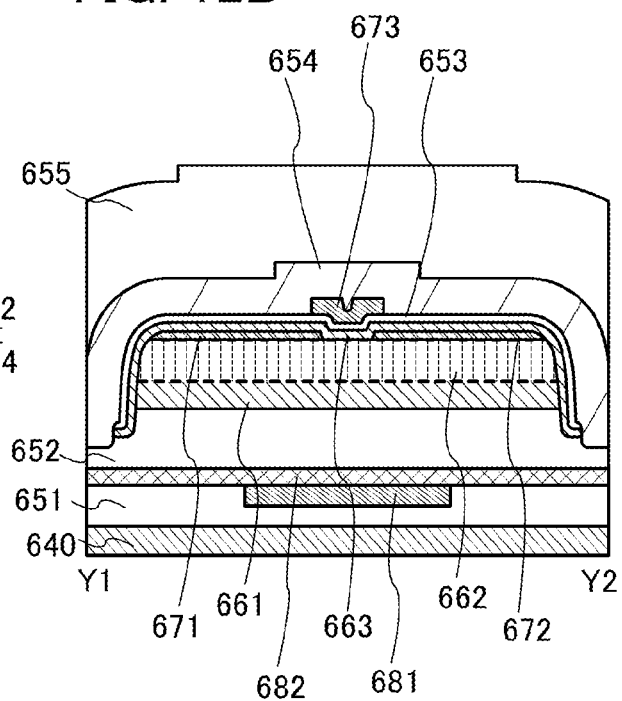
Figure 12C:
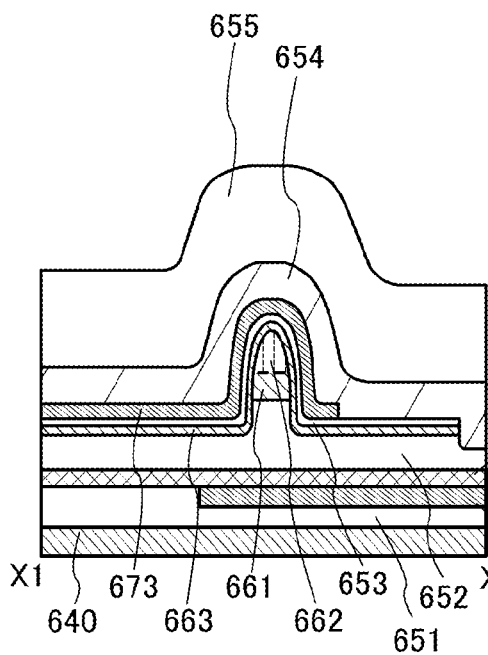
Figure 12D:
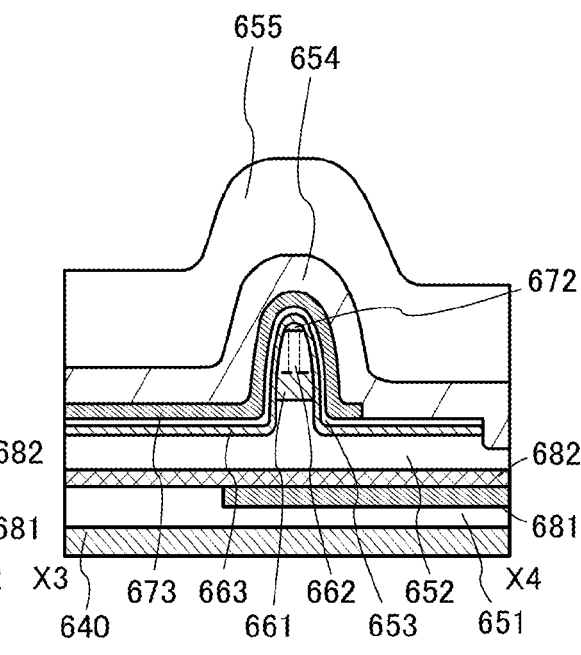

Although the example where one gate electrode is provided in the transistor is illustrated in FIGS. 9A to 9D, one embodiment of the present invention is not limited thereto. A plurality of gate electrodes may be provided in the transistor. FIGS. 12A to 12D illustrate an example where the transistor 600 illustrated in FIGS. 9A to 9D is provided with a conductive film 681 as a second gate electrode. FIG. 12A is a top view of a transistor. FIG. 12B illustrates a cross section along the dashed-dotted line Y1-Y2 in FIG. 12A. FIG. 12C illustrates a cross section along the dashed-dotted line X1-X2 in FIG. 12A. FIG. 12D illustrates a cross section along the dashed-dotted line X3-X4 in FIG. 12A. In FIGS. 12A to 12D, some components are scaled up or down or omitted for easy understanding.

The transistor illustrated in FIGS. 12A to 12D differs from the transistor illustrated in FIGS. 9A to 9D in that an insulating film 651, the conductive film 681, and an insulating film 682 are provided between the substrate 640 and the insulating film 652.

The insulating film 651 has a function of electrically isolating the substrate 640 and the conductive film 681 from each other. The insulating film 651 may be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 651, an organic resin such as a polyimide resin, a polyamide resin, an acrylic resin, a siloxane resin, an epoxy resin, or a phenol resin may be used. The insulating film 651 may be a stack including any of the above materials.

Any of the materials that can be used for the conductive film 673 can be used for the conductive film 681. The conductive film 681 functions as a second gate electrode. The conductive film 681 may be supplied with a constant potential, or a potential or a signal that is the same as that supplied to the conductive film 673.

The insulating film 682 has a function of preventing oxygen contained in the insulating film 652 from decreasing by bonding to metal contained in the conductive film 681. Any of the materials that can be used for the insulating film 654 can be used for the insulating film 682.

<Structural Example 3 of Transistor>

Figure 13A:
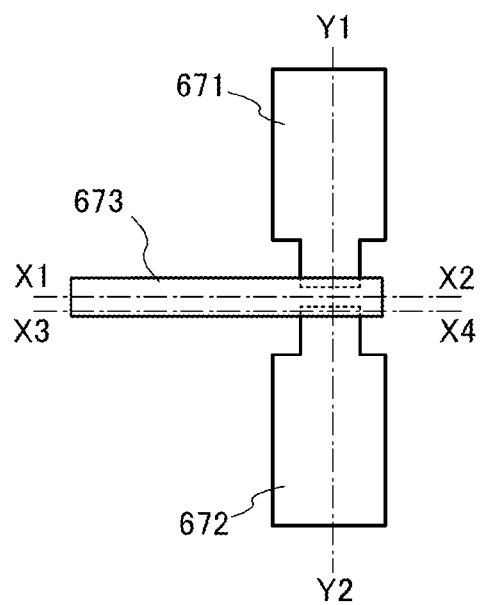
FIGS. 13A to 13D are a top view and cross-sectional views illustrating a structural example of a transistor.

In the transistor 600 in FIGS. 9A to 9D, the semiconductor 663 and the insulating film 653 may be etched at the same time as the conductive film 673. One example is illustrated in FIGS. 13A to 13D. FIG. 13A is a top view of a transistor.

Figure 13B:
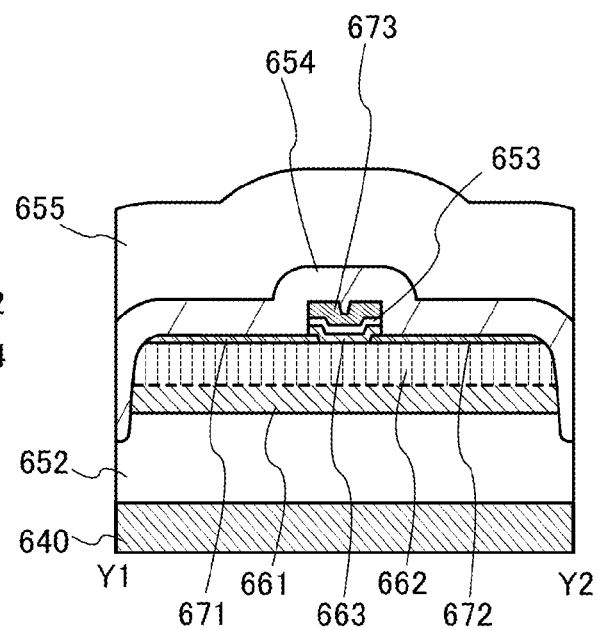
Figure 13C:
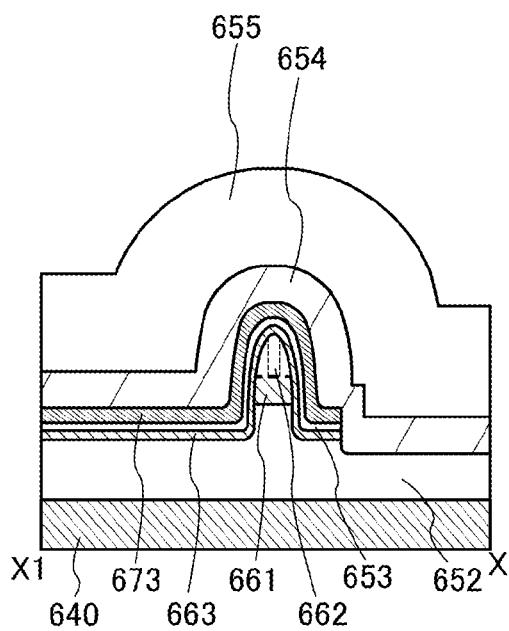
Figure 13D:
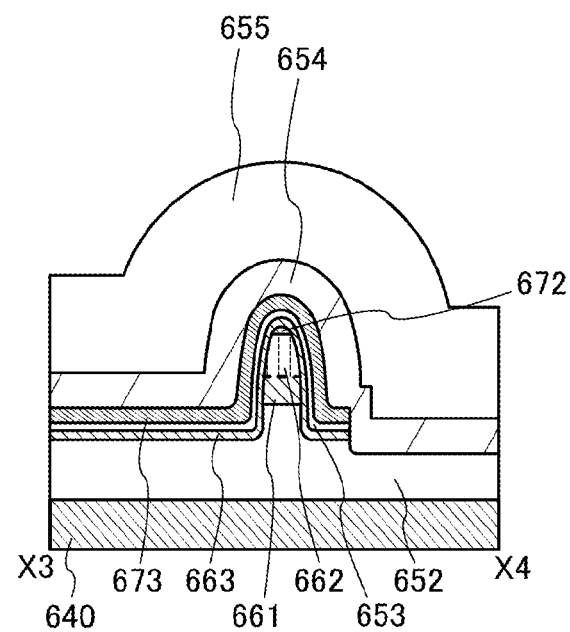

FIG. 13B illustrates a cross section along the dashed-dotted line Y1-Y2 in FIG. 13A. FIG. 13C illustrates a cross section along the dashed-dotted line X1-X2 in FIG. 13A. FIG. 13D illustrates a cross section along the dashed-dotted line X3-X4 in FIG. 13A. In FIGS. 13A to 13D, some components are scaled up or down or omitted for easy understanding.

In the transistor in FIGS. 13A to 13D, the semiconductor 663 and the insulating film 653 are provided only below the conductive film 673 and are removed in other regions.

<Structural Example 4 of Transistor>

Figure 14A:
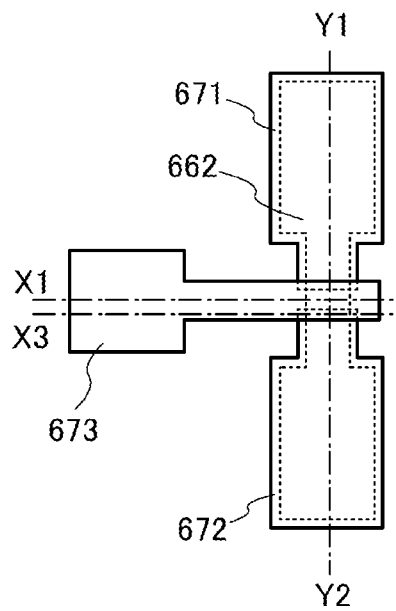
FIGS. 14A to 14D are a top view and cross-sectional views illustrating a structural example of a transistor.
Figure 14B:
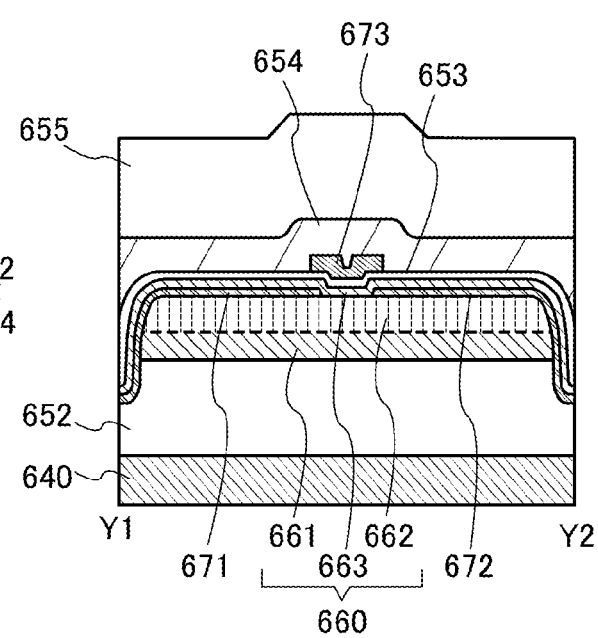
Figure 14C:
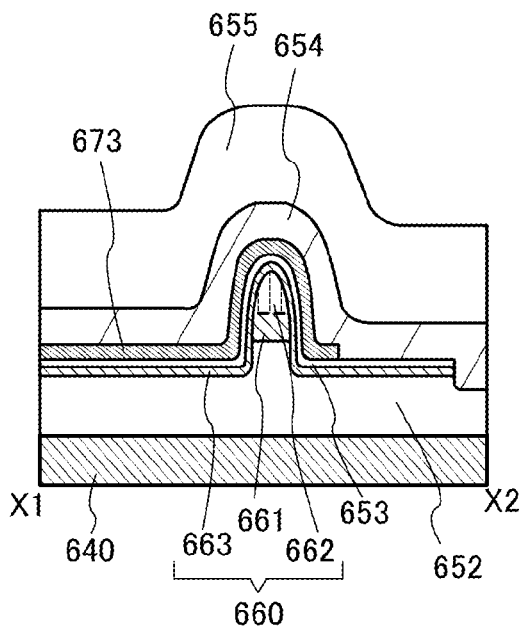
Figure 14D:
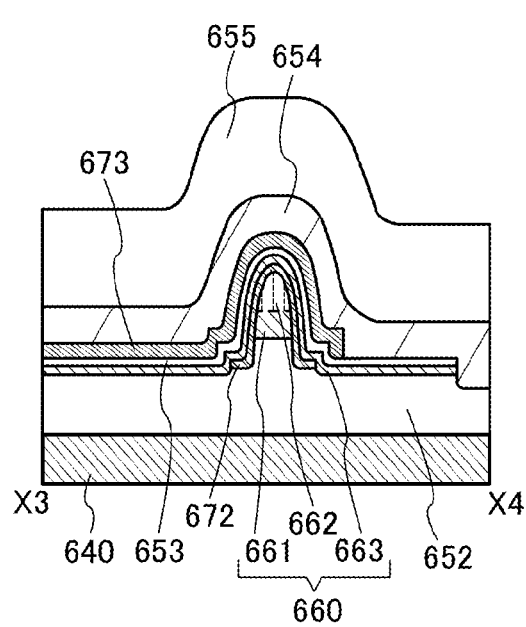

In the transistor 600 in FIGS. 9A to 9D, the conductive films 671 and 672 may be in contact with side surfaces of the semiconductors 661 and 662. One example is illustrated in FIGS. 14A to 14D. FIG. 14A is a top view of a transistor. FIG. 14B illustrates a cross section along the dashed-dotted line Y1-Y2 in FIG. 14A. FIG. 14C illustrates a cross section along the dashed-dotted line X1-X2 in FIG. 14A. FIG. 14D illustrates a cross section along the dashed-dotted line X3-X4 in FIG. 14A. In FIGS. 14A to 14D, some components are scaled up or down or omitted for easy understanding.

<Structural Example 5 of Transistor>

Figure 15A:
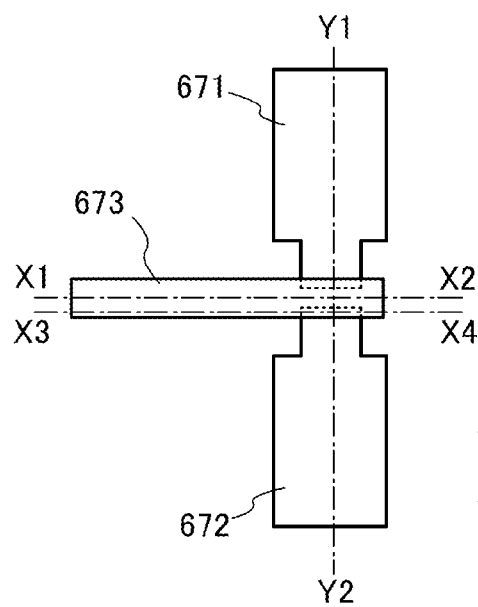
FIGS. 15A to 15D are a top view and cross-sectional views illustrating a structural example of a transistor.
Figure 15B:
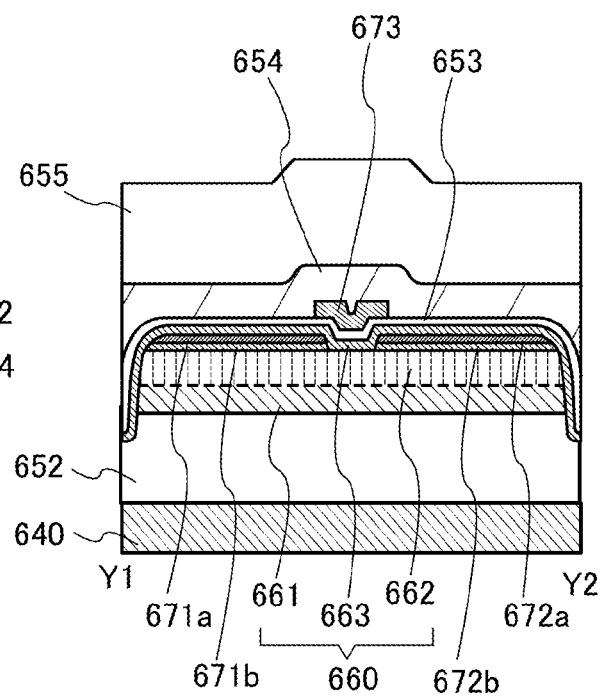
Figure 15C:
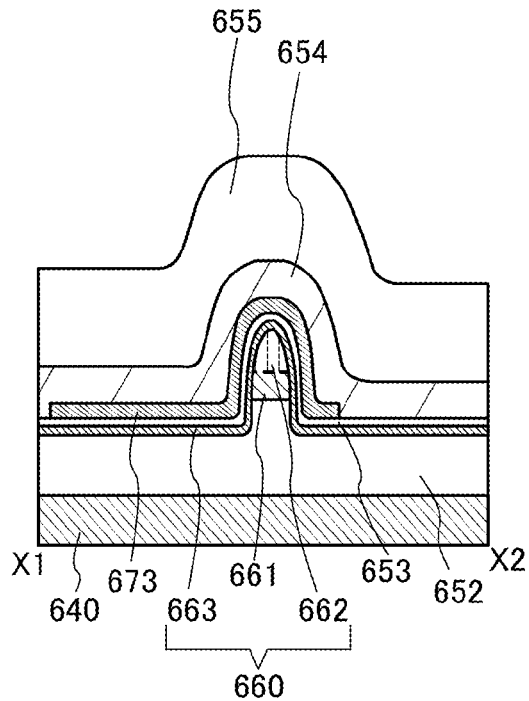
Figure 15D:
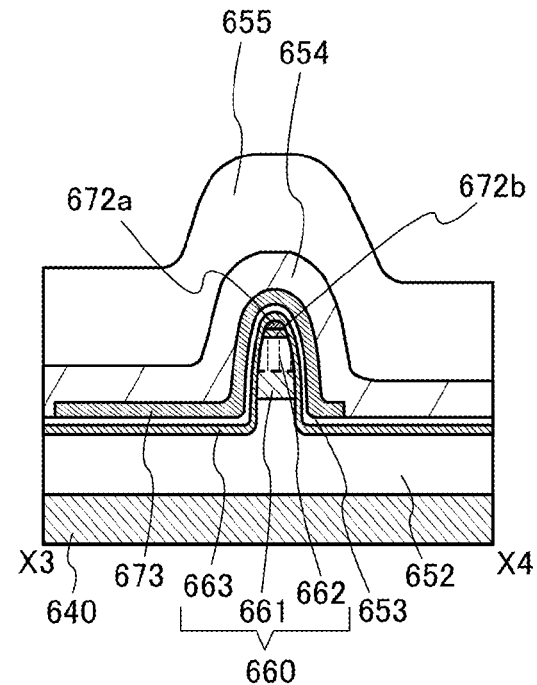

In the transistor 600 in FIGS. 9A to 9D, the conductive film 671 may have a layered structure of conductive films 671a and 671b. In addition, the conductive film 672 may have a layered structure of conductive films 672a and 672b. One example is illustrated in FIGS. 15A to 15D. FIG. 15A is a top view of a transistor. FIG. 15B illustrates a cross section along the dashed-dotted line Y1-Y2 in FIG. 15A. FIG. 15C illustrates a cross section along the dashed-dotted line X1-X2 in FIG. 15A. FIG. 15D illustrates a cross section along the dashed-dotted line X3-X4 in FIG. 15A. In FIGS. 15A to 15D, some components are scaled up or down or omitted for easy understanding.

The conductive films 671b and 672b may be formed using a transparent conductor, an oxide semiconductor, a nitride semiconductor, or an oxynitride semiconductor, for example. The conductive films 671b and 672b may be formed using, for example, a film containing indium, tin, and oxygen, a film containing indium and zinc, a film containing indium, tungsten, and zinc, a film containing tin and zinc, a film containing zinc and gallium, a film containing zinc and aluminum, a film containing zinc and fluorine, a film containing zinc and boron, a film containing tin and antimony, a film containing tin and fluorine, a film containing titanium and niobium, or the like. Alternatively, any of these films may contain hydrogen, carbon, nitrogen, silicon, germanium, or argon.

The conductive films 671b and 672b may have a property of transmitting visible light. Alternatively, the conductive films 671b and 672b may have a property of not transmitting visible light, ultraviolet light, infrared light, or X-rays by reflecting or absorbing it. In some cases, such a property can suppress a change in electrical characteristics of the transistor due to stray light.

The conductive films 671b and 672b may preferably be formed using a layer which does not form a Schottky barrier with the semiconductor 662. Accordingly, on-state characteristics of the transistor can be improved.

Each of the conductive films 671a and 672a may be formed to have, for example, a single-layer structure or a layered structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Note that the conductive films 671b and 672b may preferably be formed using a film having a resistance higher than that of the conductive films 671a and 672a. The conductive films 671b and 672b may preferably be formed using a film having a resistance lower than that of the channel of the transistor. For example, the conductive films 671b and 672b may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive films 671b and 672b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive films 671b and 672b (e.g., the film on the drain side) may preferably be provided.

<Structural Example 6 of Transistor>

Figure 16A:
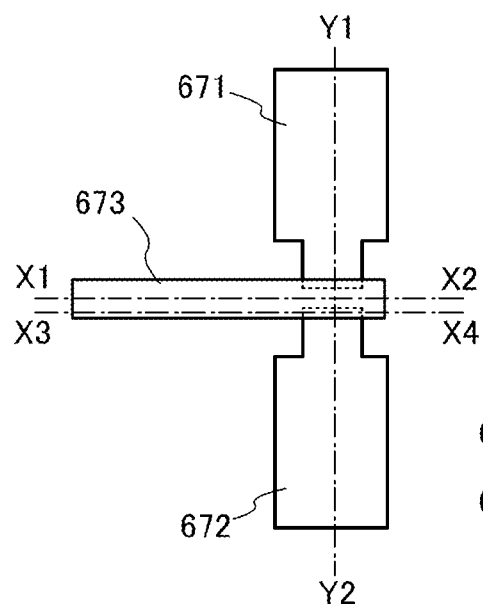
FIGS. 16A to 16D are a top view and cross-sectional views illustrating a structural example of a transistor.
Figure 16B:
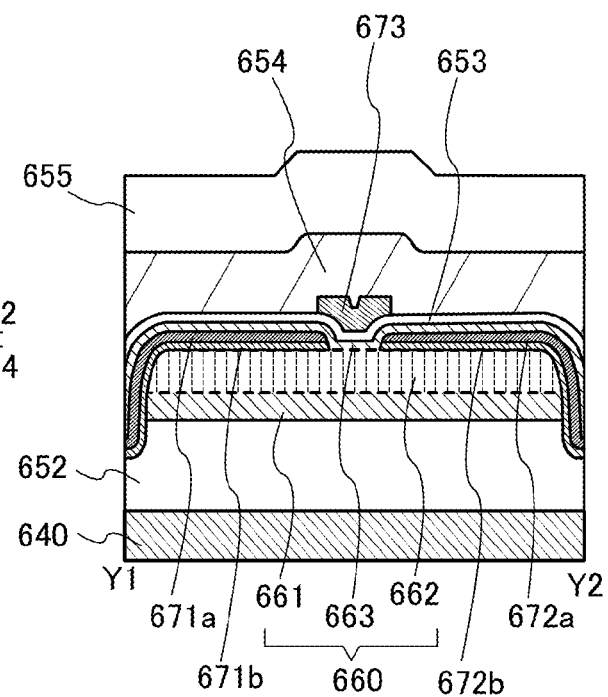
Figure 16C:
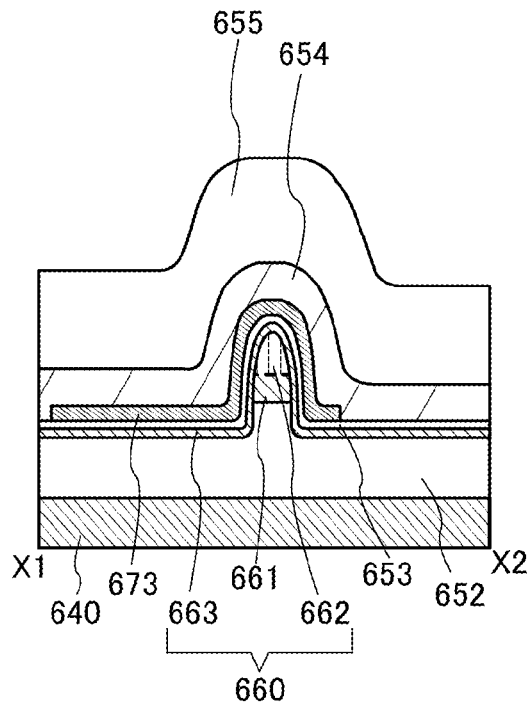
Figure 16D:
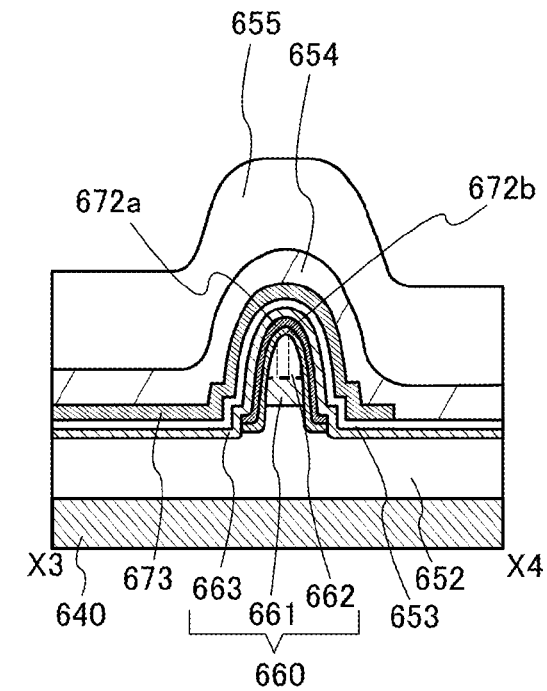

In the transistor in FIGS. 14A to 14D, the conductive film 671 may have a layered structure of conductive films 671a and 671b. In addition, the conductive film 672 may have a layered structure of conductive films 672a and 672b. One example is illustrated in FIGS. 16A to 16D. FIG. 16A is a top view of a transistor. FIG. 16B illustrates a cross section along the dashed-dotted line Y1-Y2 in FIG. 16A. FIG. 16C illustrates a cross section along the dashed-dotted line X1-X2 in FIG. 16A. FIG. 16D illustrates a cross section along the dashed-dotted line X3-X4 in FIG. 16A. In FIGS. 16A to 16D, some components are scaled up or down or omitted for easy understanding.

The description of FIGS. 15A to 15D can be referred to for the details of the conductive films 671a, 671b, 672a, and 672b in FIGS. 16A to 16D.

Embodiment 4

In this embodiment, an example of the semiconductor device described in Embodiment 1 will be described with reference to FIG. 17.

Figure 17:
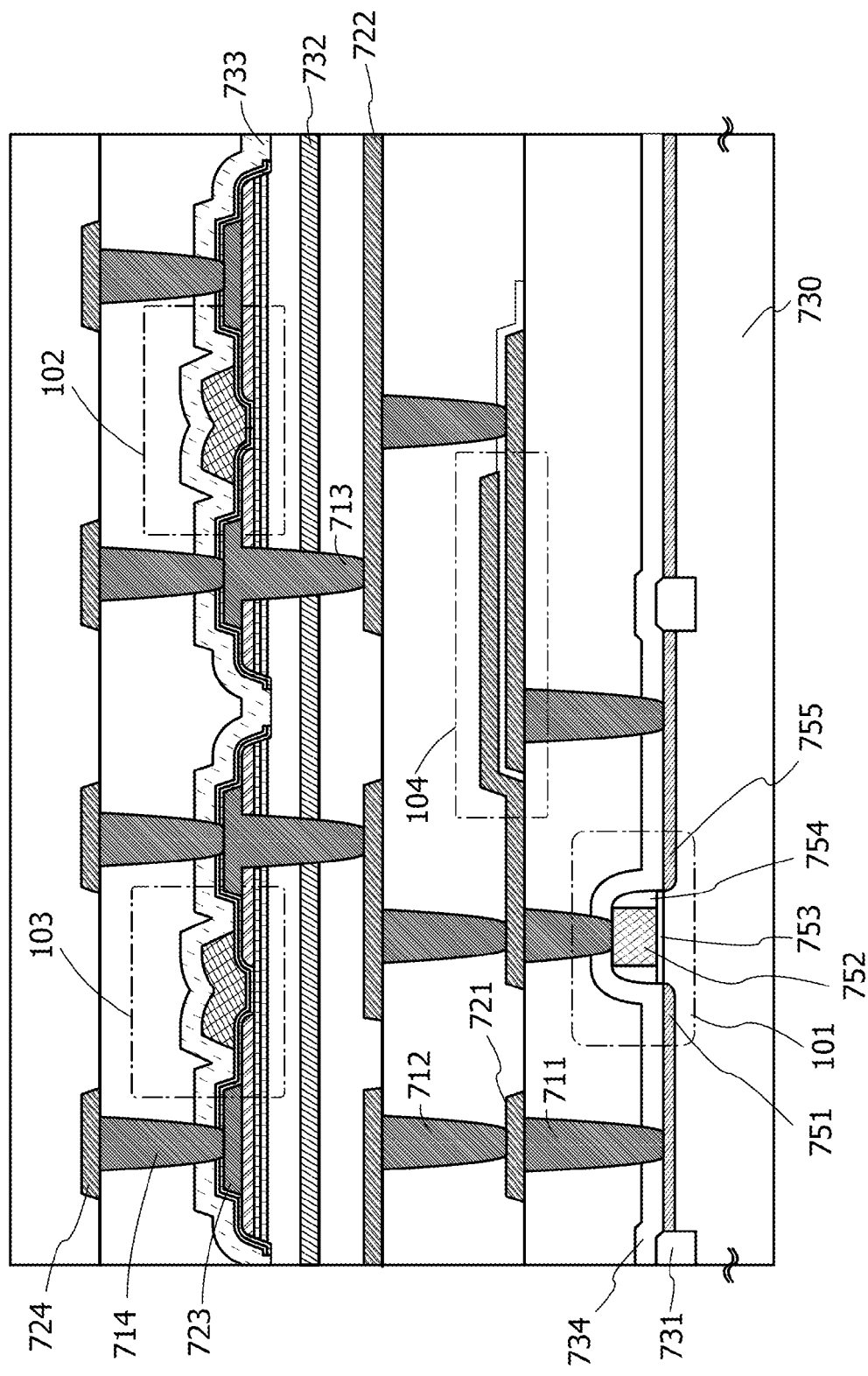
FIG. 17 is a cross-sectional view illustrating a structural example of a semiconductor device.

FIG. 17 is a cross-sectional view illustrating a structural example of the semiconductor device. The semiconductor device illustrated in FIG. 17 includes the transistor 101, the transistor 102, the transistor 103, the capacitor 104, a substrate 730, an element isolation layer 731, an insulating film 732, an insulating film 733, an insulating film 734, a plug 711, a plug 712, a plug 713, a plug 714, a wiring 721, a wiring 722, a wiring 723, and a wiring 724. Note that in the case where a reference numeral is given to one component in FIG. 17, a reference numeral is not given to the same component formed in the same layer as the one component, in order to avoid complexity.

For the transistors 102 and 103, the OS transistor described in Embodiment 3 can be used.

The transistor 101 includes impurity regions 751 and 755 functioning as a source region and a drain region, a gate electrode 752, a gate insulating film 753, and a sidewall insulating layer 754.

The transistor 101 includes a first semiconductor material, and the transistors 102 and 103 include a second semiconductor material. The first and second semiconductor materials preferably have different band gaps. For example, the first semiconductor material may be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material may be an oxide semiconductor. A transistor using a material other than an oxide semiconductor, such as single crystal silicon, can operate at high speed easily. In contrast, a transistor using an oxide semiconductor and described in the above embodiment as an example has excellent subthreshold characteristics and a minute structure. Furthermore, the transistor can operate at high speed because of its high switching speed and has low leakage current because of its low off-state current.

The transistor 101 is either an n-channel transistor or a p-channel transistor; an appropriate transistor is used depending on a circuit. In the description of this embodiment, the transistor 101 is a p-channel transistor.

The transistor 101 may be provided with an impurity region serving as a lightly doped drain (LDD) region or an extension region under the sidewall insulating layer 754. In particular, when the transistor 101 is an n-channel transistor, the LDD region or the extension region is preferably provided in order to suppress the deterioration due to hot carriers.

As the transistor 101, a transistor containing silicide (salicide) or a transistor that does not include the sidewall insulating layer 754 may be used. When a structure that contains silicide (salicide) is used, the resistance of the source region and the drain region can be further lowered and the speed of the semiconductor device can be increased. Furthermore, the semiconductor device can operate at low voltage; thus, power consumption of the semiconductor device can be reduced.

As the substrate 730, a single crystal semiconductor substrate or a polycrystalline semiconductor substrate made of silicon or silicon carbide, a compound semiconductor substrate made of silicon germanium, an SOI substrate, or the like may be used. A transistor formed using a semiconductor substrate can easily operate at high speed. In the case of using a p-type single crystal silicon substrate as the substrate 730, an impurity element imparting n-type conductivity may be added to part of the substrate 730 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 730 may be a conductor substrate or an insulating substrate provided with a semiconductor film. Examples of the conductor substrate are a metal substrate, a stainless steel substrate, a substrate including stainless steel foil, a tungsten substrate, and a substrate including tungsten foil. Examples of the insulating substrate are a glass substrate, a quartz substrate, a plastic substrate, a flexible substrate, an attachment film, paper including a fibrous material, and a base film. Examples of the glass substrate are a barium borosilicate glass substrate, an aluminoborosilicate glass substrate, and a soda lime glass substrate. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), a leather substrate, and a rubber substrate. When such a substrate is used, a transistor with excellent properties or a transistor with low power consumption can be formed, a device with high durability, high heat resistance can be provided, or reduction in weight or thickness can be achieved.

The transistor 101 is isolated from other transistors formed on the substrate 730 by the element isolation layer 731. The element isolation layer 731 can be formed using an insulator containing one or more materials selected from aluminum oxide, aluminum oxynitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, tantalum oxide, and the like.

In the case where a silicon-based semiconductor material is used for the transistor 101 provided in a lower portion, the insulating film 734 provided in the vicinity of the semiconductor film of the transistor 101 preferably contains hydrogen. Hydrogen in the insulating film 734 terminates dangling bonds of silicon; accordingly, the reliability of the transistor 101 can be improved. For the insulating film 734, silicon oxide, silicon oxynitride, silicon nitride oxide, silicon nitride, or the like can be used.

In the case where an oxide semiconductor is used for the transistors 102 and 103 provided in an upper portion, hydrogen in an insulating film provided in the vicinity of the semiconductor films of the transistors 102 and 103 becomes a factor of generating carriers in the oxide semiconductor; thus, the reliability of the transistors 102 and 103 might be decreased. Therefore, in the case where the transistors 102 and 103 using an oxide semiconductor is stacked over the transistor 101 using a silicon-based semiconductor material, it is particularly effective that the insulating film 732 having a function of preventing diffusion of hydrogen is provided between the transistor 101 and the transistors 102 and 103. The insulating film 732 makes hydrogen remain in the lower portion, thereby improving the reliability of the transistors 102 and 103. In addition, since the insulating film 732 suppresses diffusion of hydrogen from the lower portion to the upper portion, the reliability of the transistor 101 can also be improved.

The insulating film 732 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

In addition, the insulating film 733 having a function of preventing hydrogen diffusion is preferably formed so as to cover the transistors 102 and 103 including oxide semiconductor films. For the insulating film 733, a material that is similar to that for the insulating film 732 can be used, and in particular, aluminum oxide is preferably used. The aluminum oxide film has a high shielding (blocking) effect of preventing penetration of both oxygen and impurities such as hydrogen and moisture. Thus, by using the aluminum oxide film as the insulating film 733 that covers the transistors 102 and 103, release of oxygen from the oxide semiconductor films included in the transistors 102 and 103 and entry of water and hydrogen into the oxide semiconductor films can be prevented.

The plugs 711 to 714 preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the plugs are preferably formed using a low-resistance conductive material such as aluminum or copper. The plugs are more preferably formed using a Cu—Mn alloy, in which case manganese oxide formed at the interface with an insulator containing oxygen has a function of preventing Cu diffusion.

The wirings 721 to 724 preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the wirings are preferably formed using a low-resistance conductive material such as aluminum or copper. The wirings are further preferably formed using a Cu—Mn alloy, in which case manganese oxide formed at the interface with an insulator containing oxygen has a function of preventing Cu diffusion.

The plug 713 and the wiring 723 may be formed in the same manufacturing process.

The transistor described in Embodiment 2 may also be formed over the transistors 102 and 103 as necessary.

In FIG. 17, regions without reference numerals and hatch patterns represent regions formed of an insulator. The regions can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the regions, an organic resin such as a polyimide resin, a polyamide resin, an acrylic resin, a siloxane resin, an epoxy resin, or a phenol resin can be used.

Figure 18A:
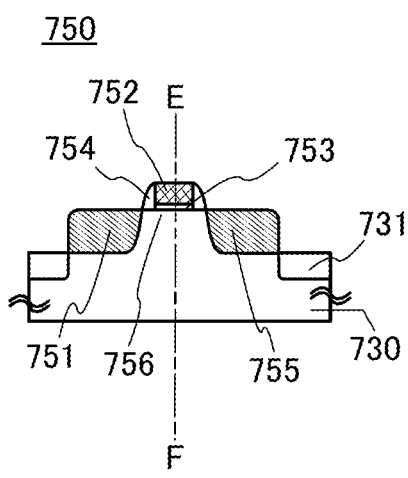
FIGS. 18A and 18B are cross-sectional views illustrating a structural example of a transistor.
Figure 18B:
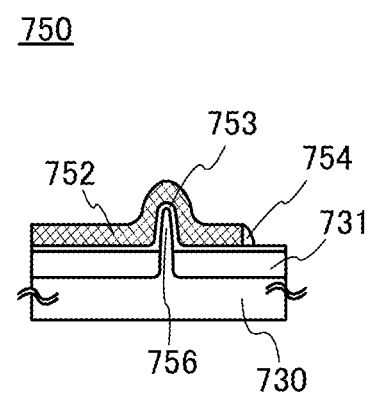

Here, instead of each of the transistor 101, a transistor 750 illustrated in FIGS. 18A and 18B may be used. FIG. 18B illustrates a cross section along the dashed-dotted line E-F in FIG. 18A. In the transistor 750, a semiconductor layer 756 (a portion of the semiconductor substrate) in which a channel is formed has a protrusion, and the gate insulating film 753 and the gate electrode 752 are provided along top and side surfaces of the protrusion. In addition, the element isolation layer 731 is provided. The transistor having such a shape is also referred to as a FIN transistor because it utilizes a protruding portion of the semiconductor substrate. Note that an insulating film serving as a mask for forming the protruding portion may be provided in contact with the top of the protruding portion. Although the case where the protruding portion is formed by processing a portion of the semiconductor substrate is described here, a semiconductor layer having a protruding shape may be formed by processing an SOI substrate.

When the semiconductor device has the structure illustrated in FIG. 17, the OS transistors and the PMOS transistors can be formed over the same substrate. Since the transistors 102 and 103 occupy a small area, a highly integrated semiconductor device can be provided.

Note that one embodiment of the present invention is not limited thereto. Depending on cases or circumstances, any of a variety of semiconductors can be used instead of an oxide semiconductor. Depending on cases or circumstances, for example, silicon, germanium, silicon germanium, silicon carbide, gallium arsenide, aluminum gallium arsenide, indium phosphide, gallium nitride, an organic semiconductor, or the like may be used instead of an oxide semiconductor.

The structures, methods, and the like described in this embodiment can be used as appropriate in combination with any of the structures, methods, and the like described in other embodiments.

Embodiment 5

A configuration example of a semiconductor device including the semiconductor device of one embodiment of the present invention will be described with reference to FIG. 19.

Figure 19:
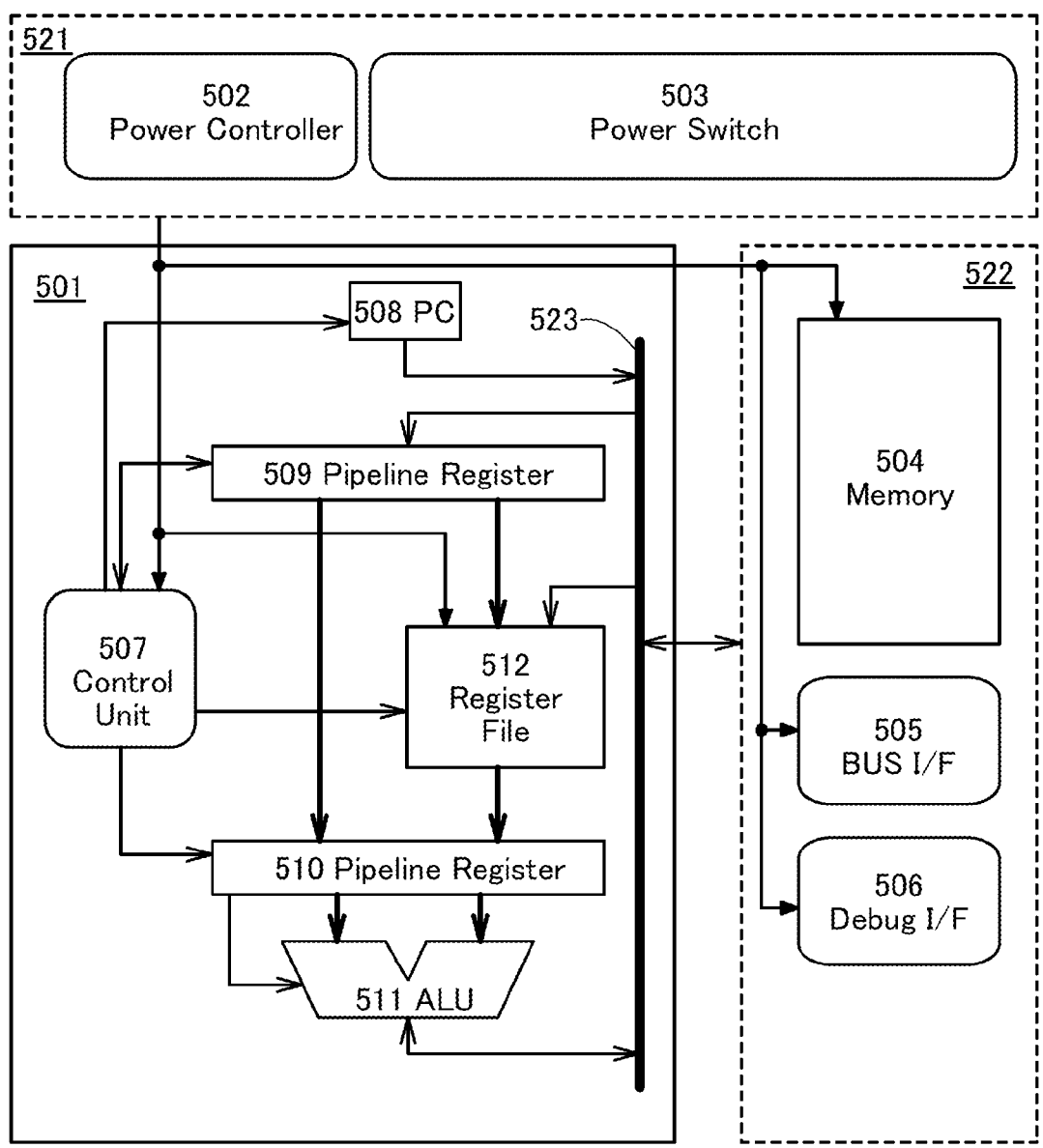
FIG. 19 is a block diagram illustrating an example of a CPU.

A semiconductor device 500 illustrated in FIG. 19 includes a CPU core 501, a power management unit 521, and a peripheral circuit 522. The power management unit 521 includes a power controller 502 and a power switch 503. The peripheral circuit 522 includes a memory 504, a bus interface (BUS I/F) 505, and a debug interface (Debug I/F) 506. The CPU core 501 includes a data bus 523, a control unit 507, a program counter (PC) 508, a pipeline register 509, a pipeline register 510, an arithmetic logic unit (ALU) 511, and a register file 512. Data is transmitted between the CPU core 501 and the peripheral circuit 522 such as the memory 504 via the data bus 523.

The semiconductor device of one embodiment of the present invention can be used in the memory 504, whereby the memory can have a small size, a high density, and a large capacity. Thus, a miniaturized semiconductor device, a semiconductor device with larger storage capacity, a semiconductor device capable of higher-speed operation, or a semiconductor device with lower power consumption can be provided.

The control unit 507 has functions of totally controlling operations of the PC 508, the pipeline register 509, the pipeline register 510, the ALU 511, the register file 512, the memory 504, the bus interface 505, the debug interface 506, and the power controller 502; and decoding and executing instructions contained in a program such as input applications.

The ALU 511 has a function of performing a variety of arithmetic operations such as four arithmetic operations and logic operations.

The PC 508 is a register having a function of storing an address of an instruction to be executed next.

The pipeline register 509 has a function of temporarily storing instruction data.

The register file 512 includes a plurality of registers including a general purpose register and can store data that is read from a main memory, data obtained as a result of arithmetic operations in the ALU 511, or the like.

The pipeline register 510 has a function of temporarily storing data used for arithmetic operations performed in the ALU 511, data obtained as a result of arithmetic operations in the ALU 511, or the like.

The bus interface 505 functions as a path for data between the semiconductor device 500 and devices outside the semiconductor device 500. The debug interface 506 functions as a path of a signal for inputting an instruction to control debugging to the semiconductor device 500.

The power switch 503 has a function of controlling supply of the power supply voltage to circuits other than the power controller 502 in the semiconductor device 500. These circuits belong to several different power domains. The power switch 503 controls whether the power supply voltage is supplied to circuits in the same power domain. The power controller 502 has a function of controlling the operation of the power switch 503.

The semiconductor device 500 having the above-described configuration can perform power gating. An example of the flow of the power gating operation will be described.

First, the CPU core 501 sets the timing for stopping the supply of the power supply voltage in a register of the power controller 502. Next, an instruction to start power gating is sent from the CPU core 501 to the power controller 502. Then, the registers and the memory 504 in the semiconductor device 500 start data saving. Subsequently, the power switch 503 stops the supply of the power supply voltage to the circuits other than the power controller 502 in the semiconductor device 500. Then, an interrupt signal is input to the power controller 502, thereby starting the supply of the power supply voltage to the circuits included in the semiconductor device 500. Note that a counter may be provided in the power controller 502 to be used to determine the timing of starting the supply of the power supply voltage regardless of input of an interrupt signal. Next, the registers and the memory 504 start data restoration. After that, execution of an instruction is resumed in the control unit 507.

This power gating can be performed in the entire processor or one or more logic circuits included in the processor. The supply of power can be stopped even for a short time. Accordingly, power consumption can be reduced at a fine granularity in space or time.

In the case where the semiconductor device of one embodiment of the present invention is used in the memory 504, the memory 504 can hold data for a long time even when the supply of a power supply voltage is stopped. Thus, the memory 504 can keep holding data at the time of power gating and there is no need to store the data in a different place. As a result, power and time therefor are not required. In other words, in the case where not the semiconductor device of one embodiment of the present invention but a volatile SRAM is used in the memory 504, data in the memory needs to be stored outside the semiconductor device 500 at the time of power gating. In the case where data is stored outside the semiconductor device 500, the time and energy for taking data from the outside of the semiconductor device 500 (i.e., the time and energy necessary to warm up the memory) is required for restoration, while in the case of using the semiconductor device of one embodiment of the present invention, such time and energy are not required. Furthermore, in the case where data is stored outside the semiconductor device 500, the time and power necessary for storing and restoring data are required, while in the case of using the semiconductor device of one embodiment of the present invention, such time and power are not required.

Note that the semiconductor device of one embodiment of the present invention can be used for not only a CPU but also a graphics processing unit (GPU), a programmable logic device (PLD), a digital signal processor (DSP), a microcontroller unit (MCU), a radio frequency (RF) tag, a radio frequency integrated circuit (RFIC), a custom LSI, and the like.

Embodiment 6

A configuration example of a semiconductor device including the semiconductor device of one embodiment of the present invention will be described with reference to FIG. 20.

Figure 20:
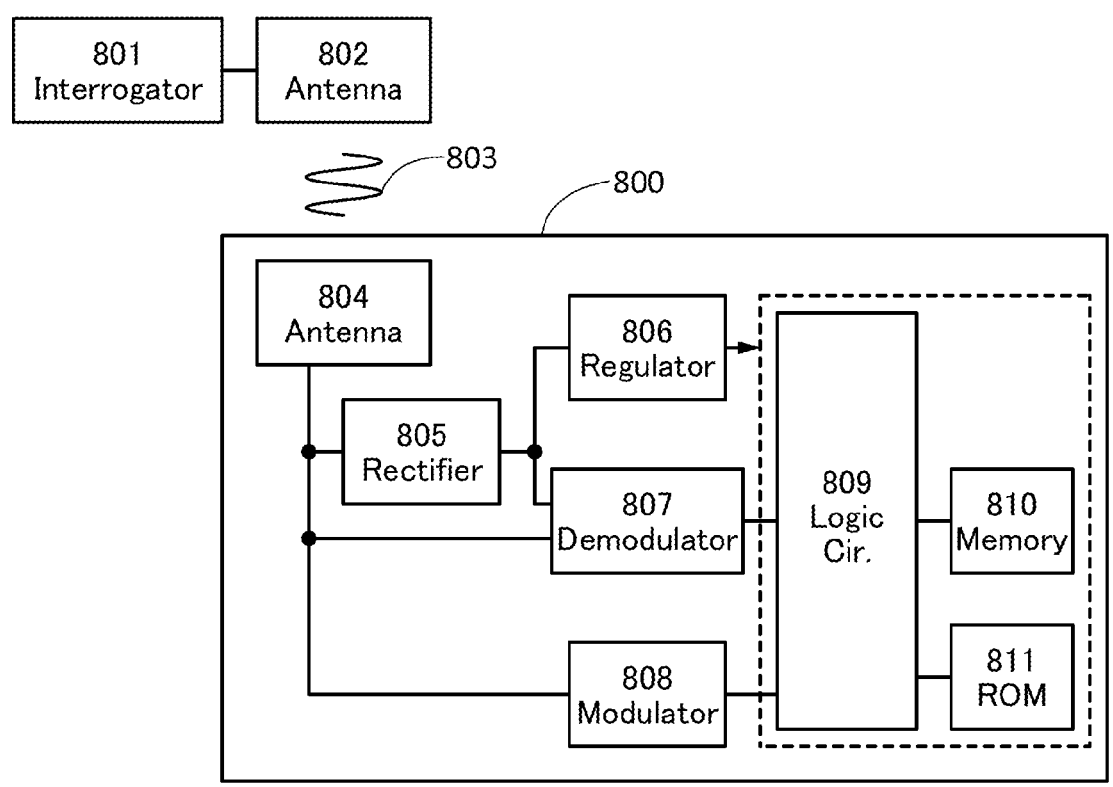
FIG. 20 is a block diagram illustrating an example of an RFIC.

A semiconductor device 800 illustrated in FIG. 20 is a configuration example of an RFIC. The RFIC of this embodiment includes a memory circuit, stores necessary data in the memory circuit, and transmits and receives data to/from the outside with use of contactless means, for example, wireless communication. The RFIC with these features can be used for an individual authentication system in which an object or the like is recognized by reading the individual information, for example.

The semiconductor device 800 illustrated in FIG. 20 includes an antenna 804, a rectifier circuit 805, a constant voltage circuit 806, a demodulation circuit 807, a modulation circuit 808, a logic circuit 809, a memory circuit 810, and a ROM 811.

The semiconductor device of one embodiment of the present invention can be used in the memory circuit 810, whereby the memory circuit 810 can have a small size, a high density, and a large capacity. Thus, a miniaturized semiconductor device or a semiconductor device with larger storage capacity can be provided.

The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that as the data transmission method, there are an electromagnetic coupling method in which a pair of coils is provided so as to face each other and communicates with each other by mutual induction, an electromagnetic induction method in which communication is performed using an induction field, a radio wave method in which communication is performed using a radio wave, and the like. Any of these methods can be used in the semiconductor device 800 described in this embodiment.

Note that whether each circuit described above is provided can be determined as appropriate as needed.

In the circuits other than the memory circuit 810, the transistors including an oxide semiconductor described in the above embodiment can be used as n-channel transistors. Since the transistors including an oxide semiconductor have low off-state currents and high on-state currents, both a low leakage current and high-speed operation can be achieved. Furthermore, the transistors including an oxide semiconductor described in the above embodiment may be used as elements having a rectifying function included in the demodulation circuit 807. Since the transistors have low off-state currents, the reverse currents of the elements having a rectifying function can be made low, leading to excellent rectification efficiency. Furthermore, since the transistors including an oxide semiconductor can be formed through the same process, high performance of the semiconductor device 800 can be achieved without an increase in process cost.

This embodiment can be combined as appropriate with any of the other embodiments described in this specification.

Embodiment 7

In this embodiment, an example where the semiconductor device described in the foregoing embodiment is used as an electronic component will be described with reference to FIGS. 21A and 21B.

Figure 21A:
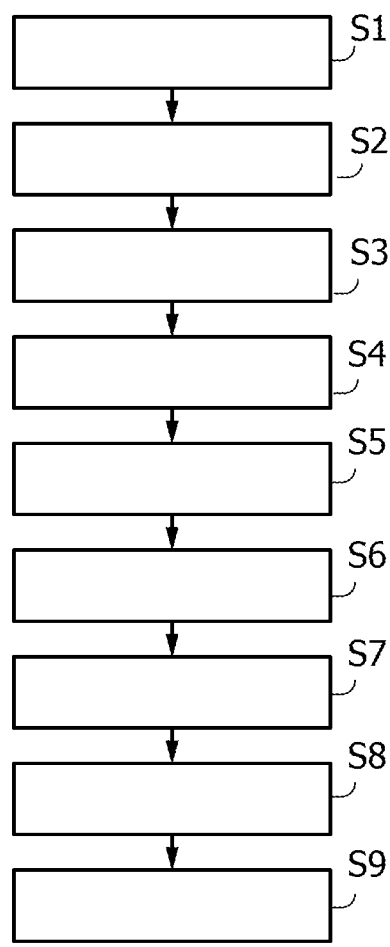
FIG. 21A illustrates an example where a semiconductor device is used as an electronic component and FIG. 21B illustrates an example of the electronic component.

FIG. 21A shows an example where the semiconductor device described in the foregoing embodiment is used as an electronic component. Note that an electronic component is also referred to as semiconductor package or IC package. For the electronic component, there are various standards and names corresponding to the extraction direction of terminals or the shape of terminals; hence, one example of the electronic component will be described in this embodiment.

A semiconductor device including the transistors described in FIG. 17 is completed by integrating detachable components on a printed circuit board through an assembly process (post-process).

The post-process can be completed through steps shown in FIG. 21A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, leading to reduction of damage to the circuit portion and the wire embedded in the component that is caused by external mechanical force as well as reduction of deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The above-described electronic component can include the semiconductor device described in the above embodiment. Accordingly, an electronic component including the memory device with a small size, a high density, or a large capacity can be provided. The electronic component is an electronic component with a small size or a large storage capacity.

Figure 21B:
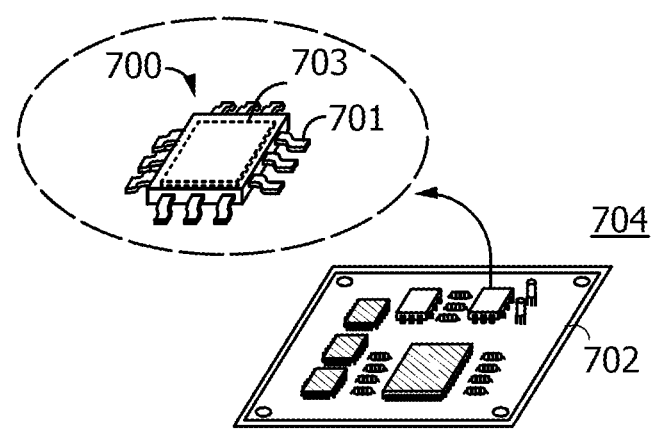

FIG. 21B is a schematic perspective diagram of a completed electronic component. FIG. 21B shows a schematic perspective diagram of a quad flat package (QFP) as an example of the electronic component. An electronic component 700 illustrated in FIG. 21B includes a lead 701 and a semiconductor device 703. The electronic component 700 in FIG. 21B is, for example, mounted on a printed circuit board 702. A plurality of electronic components 700 are used in combination and electrically connected to each other over the printed circuit board 702; thus, a substrate on which the electronic components are mounted (a circuit board 704) is completed. The completed circuit board 704 is provided in an electronic device or the like.

Embodiment 8

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 22A to 22F illustrate specific examples of these electronic devices.

Figure 22A:
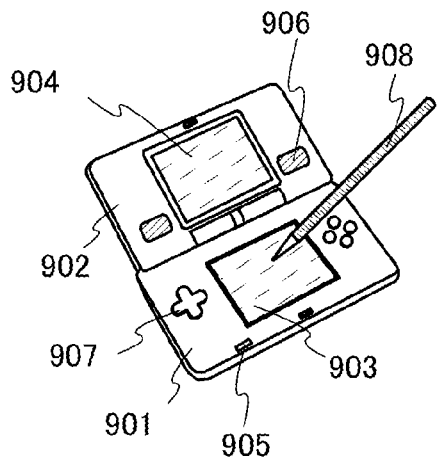
FIGS. 22A to 22F each illustrate an example of an electronic device.

FIG. 22A illustrates a portable game machine including a housing 901, a housing 902, a display portion 903, a display portion 904, a microphone 905, a speaker 906, an operation key 907, a stylus 908, and the like. Although the portable game machine in FIG. 22A has the two display portions 903 and 904, the number of display portions included in a portable game machine is not limited to this.

Figure 22B:
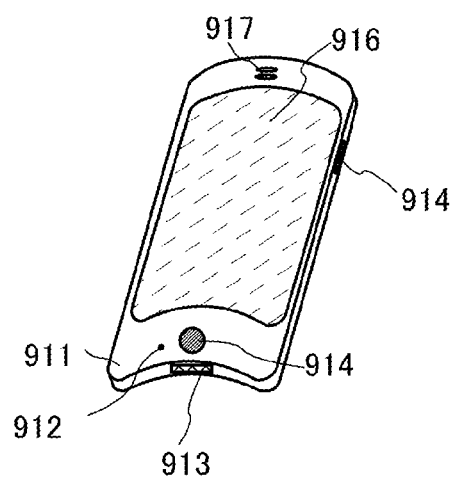

FIG. 22B illustrates a cellular phone provided with a housing 911, a display portion 916, operation buttons 914, an external connection port 913, a speaker 917, a microphone 912, and the like. When the display portion 916 of the cellular phone illustrated in FIG. 22B is touched with a finger or the like, data can be input. Furthermore, operations such as making a call and inputting text can be performed by touch on the display portion 916 with a finger or the like. The power can be turned on or off with the operation button 914. In addition, the type of image displayed on the display portion 916 can be switched; for example, switching from a mail creation screen to a main menu screen is performed with the operation button 914.

Figure 22C:
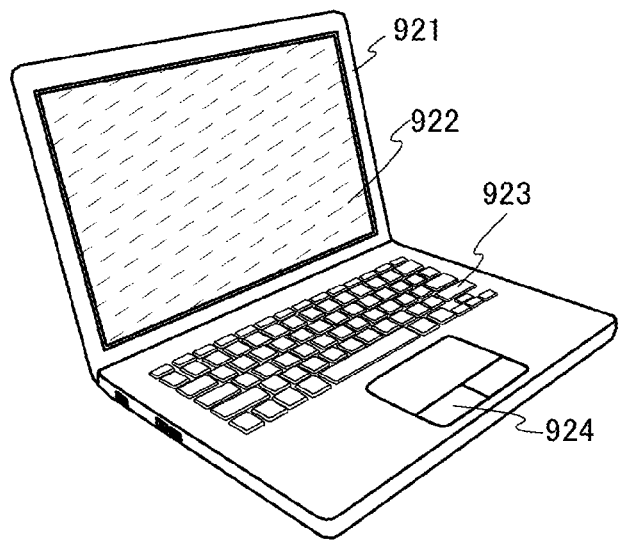

FIG. 22C illustrates a notebook personal computer including a housing 921, a display portion 922, a keyboard 923, a pointing device 924, and the like.

Figure 22D:
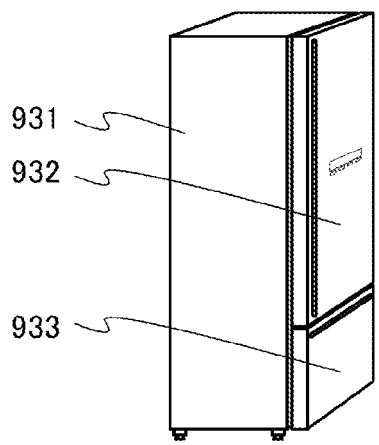

FIG. 22D illustrates an electric refrigerator-freezer including a housing 931, a door for a refrigerator 932, a door for a freezer 933, and the like.

Figure 22E:
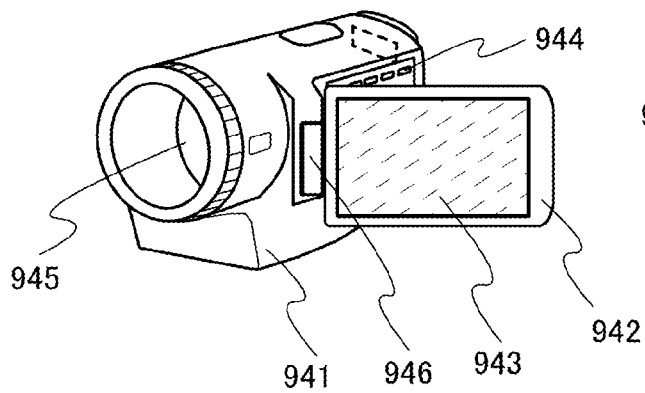

FIG. 22E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. An image displayed on the display portion 943 may be changed in accordance with the angle at the joint 946 between the first housing 941 and the second housing 942.

Figure 22F:
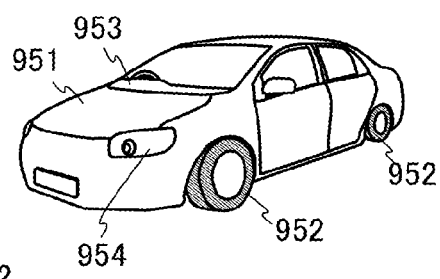
Figure 23A:
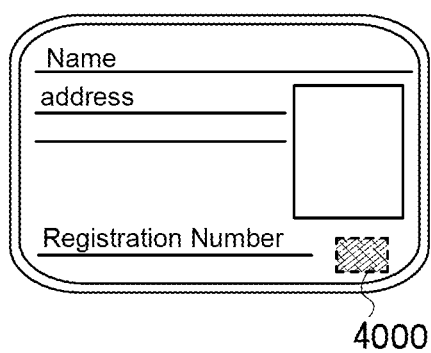
FIGS. 23A to 23F each illustrate a usage example of an RFIC.
Figure 23B:
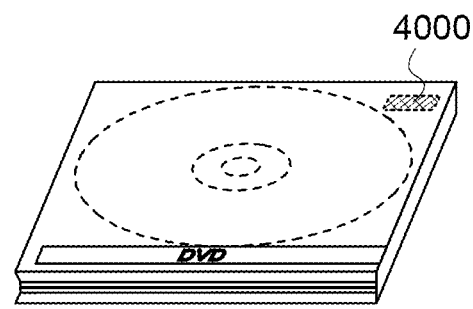
Figure 23C:
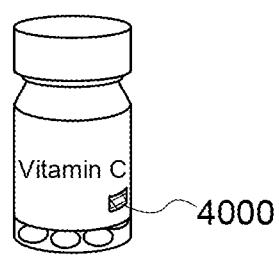
Figure 23D:
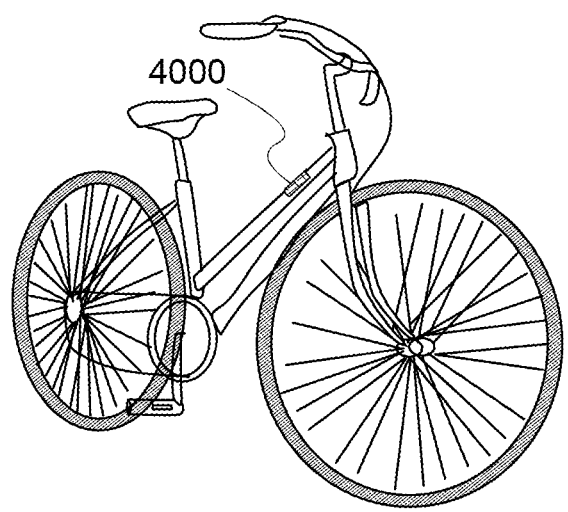
Figure 23E:
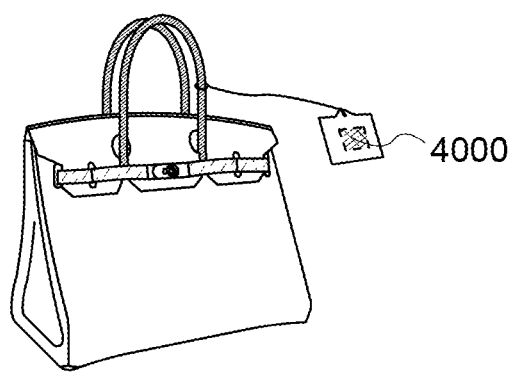
Figure 23F:
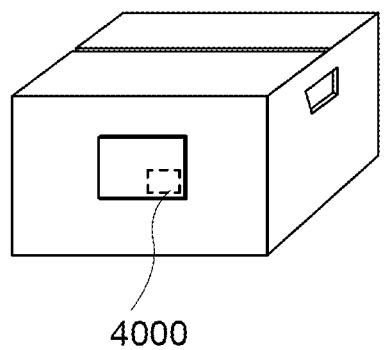

FIG. 22F illustrates a vehicle including a car body 951, wheels 952, a dashboard 953, lights 954, and the like.

Note that this embodiment can be combined as appropriate with any of the other embodiments in this specification.

Embodiment 9

In this embodiment, application examples of an RFIC which can include the semiconductor device of one embodiment of the present invention will be described with reference to FIGS. 23A to 23F. The RFIC is widely used and can be provided for, for example, human bodies, products such as bills, coins, securities, bearer bonds, documents (e.g., driver's licenses or resident cards, see FIG. 23A), recording media (e.g., DVDs or video tapes, see FIG. 23B), packaging containers (e.g., wrapping paper or bottles, see FIG. 23C), vehicles (e.g., bicycles, see FIG. 23D), personal belongings (e.g., bags or glasses), foods, plants, animals, clothes, household goods, medical supplies such as medicine and chemicals, and electronic devices (e.g., liquid crystal display devices, EL display devices, television devices, or cellular phones), or tags on products (see FIGS. 23E and 23F).

An RFIC 4000 of one embodiment of the present invention is fixed to products by being attached to a surface thereof or embedded therein. For example, the RFIC 4000 is fixed to each product by being embedded in paper of a book, or embedded in an organic resin of a package. Since the RFIC 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFIC 4000 of one embodiment of the present invention, and the identification function can be utilized to prevent counterfeiting. Moreover, the efficiency of a system such as an inspection system can be improved by providing the RFIC of one embodiment of the present invention for packaging containers, recording media, personal belongings, foods, clothing, household goods, electronic devices, or the like. Vehicles can also have higher security against theft or the like by being provided with the RFIC of one embodiment of the present invention.

As described above, by using the RFIC of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFIC can be preferably used for application in which data is not frequently written or read.

This embodiment can be implemented in appropriate combination with any of the other embodiments.

This application is based on Japanese Patent Application serial no. 2014-175609 filed with the Japan Patent Office on Aug. 29, 2014, the entire contents of which are hereby incorporated by reference.

What is claimed is:

1. A semiconductor device comprising:
   a memory cell; and
   first to fifth wirings,
   wherein the memory cell includes a first transistor, a second transistor, a third transistor, and a first capacitor,
   wherein one of a source and a drain of the first transistor is electrically connected to the first wiring,
   wherein the other of the source and the drain of the first transistor is electrically connected to one terminal of the first capacitor and one of a source and a drain of the second transistor,
   wherein a gate of the first transistor is electrically connected to the other terminal of the first capacitor and one of a source and a drain of the third transistor,
   wherein the other of the source and the drain of the second transistor is electrically connected to the fifth wiring,
   wherein a gate of the second transistor is electrically connected to the third wiring,
   wherein the other of the source and the drain of the third transistor is electrically connected to the second wiring,
   wherein a gate of the third transistor is electrically connected to the fourth wiring, and
   wherein the second wiring is not electrically connected to the fifth wiring.

2. The semiconductor device according to claim 1, further comprising:
   a fourth transistor;
   a fifth transistor;
   a first circuit; and
   sixth to eighth wirings,
   wherein one of a source and a drain of the fourth transistor is electrically connected to the fifth wiring,
   wherein the other of the source and the drain of the fourth transistor is electrically connected to the eighth wiring,
   wherein a gate of the fourth transistor is electrically connected to the sixth wiring,
   wherein one of a source and a drain of the fifth transistor is electrically connected to the first circuit, wherein the other of the source and the drain of the fifth transistor is electrically connected to the fifth wiring, wherein a gate of the fifth transistor is electrically connected to the seventh wiring, and wherein the first circuit has a function of determining whether a current flowing through the fifth wiring is equal to a current flowing through the fourth transistor.

3. The semiconductor device according to claim 2, wherein the first transistor and the fourth transistor are p-channel transistors.

4. The semiconductor device according to claim 1, wherein the first transistor is an n-channel transistor.

5. An electronic device comprising:
the semiconductor device according to claim 1; and
at least one of a display device, a microphone, an operation key, and a housing.

6. A semiconductor device comprising:
a memory cell; and
first to fifth wirings,
wherein the memory cell includes a first transistor, a second transistor, a third transistor, and a first capacitor,
wherein one of a source and a drain of the first transistor is electrically connected to the first wiring,
wherein the other of the source and the drain of the first transistor is electrically connected to one terminal of the first capacitor and one of a source and a drain of the second transistor,
wherein a gate of the first transistor is electrically connected to the other terminal of the first capacitor and one of a source and a drain of the third transistor,
wherein the other of the source and the drain of the second transistor is electrically connected to the fifth wiring,
wherein a gate of the second transistor is electrically connected to the third wiring,
wherein the other of the source and the drain of the third transistor is electrically connected to the second wiring, wherein a gate of the third transistor is electrically connected to the fourth wiring, wherein the second wiring is not electrically connected to the fifth wiring, and wherein the second transistor and the third transistor comprise an oxide semiconductor.

7. The semiconductor device according to claim 6, further comprising:
a fourth transistor;
a fifth transistor;
a first circuit; and
sixth to eighth wirings,
wherein one of a source and a drain of the fourth transistor is electrically connected to the fifth wiring,
wherein the other of the source and the drain of the fourth transistor is electrically connected to the eighth wiring,
wherein a gate of the fourth transistor is electrically connected to the sixth wiring,
wherein one of a source and a drain of the fifth transistor is electrically connected to the first circuit,
wherein the other of the source and the drain of the fifth transistor is electrically connected to the fifth wiring,
wherein a gate of the fifth transistor is electrically connected to the seventh wiring, and
wherein the first circuit has a function of determining whether a current flowing through the fifth wiring is equal to a current flowing through the fourth transistor.

8. The semiconductor device according to claim 7, wherein the first transistor and the fourth transistor are p-channel transistors.

9. The semiconductor device according to claim 6, wherein the first transistor is an n-channel transistor.

10. An electronic device comprising:
the semiconductor device according to claim 6; and
at least one of a display device, a microphone, an operation key, and a housing.

* * * * *